United States Patent
Fujikawa

(10) Patent No.: US 6,683,669 B1
(45) Date of Patent: Jan. 27, 2004

(54) APPARATUS AND METHOD FOR FABRICATING SUBSTRATE OF A LIQUID CRYSTAL DISPLAY DEVICE AND INTERCONNECTS THEREIN

(75) Inventor: Yohsuke Fujikawa, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 289 days.

(21) Appl. No.: 09/633,272

(22) Filed: Aug. 4, 2000

(30) Foreign Application Priority Data

Aug. 6, 1999 (JP) .......................... 11-224649
May 29, 2000 (JP) ....................... 2000-158601

(51) Int. Cl.⁷ ..................... G02F 1/1345; G02F 1/1339
(52) U.S. Cl. ..................... 349/149; 349/152; 349/153
(58) Field of Search ..................... 349/149, 152, 349/153

(56) References Cited

U.S. PATENT DOCUMENTS

| | | | | |
|---|---|---|---|---|
| 5,757,450 A | * | 5/1998 | Fujii et al. | 349/106 |
| 5,825,450 A | * | 10/1998 | Date et al. | 349/149 |
| 5,949,502 A | * | 9/1999 | Matsunaga et al. | 349/40 |
| 5,982,470 A | * | 11/1999 | Nakahara et al. | 349/153 |
| 6,172,732 B1 | * | 1/2001 | Hayakawa et al. | 349/152 |
| 6,184,962 B1 | * | 2/2001 | Suzuki et al. | 349/143 |
| 6,522,378 B1 | * | 2/2003 | Mizuno et al. | 349/139 |

FOREIGN PATENT DOCUMENTS

| | | |
|---|---|---|
| JP | A5173165 | 7/1993 |
| JP | A5224226 | 9/1993 |
| JP | A5299790 | 11/1993 |
| JP | A6324302 | 11/1994 |
| JP | A9101535 | 4/1997 |
| JP | B2-2870016 | 1/1999 |

* cited by examiner

Primary Examiner—Julie Ngo
(74) Attorney, Agent, or Firm—Birch, Stewart, Kolasch & Birch, LLP

(57) ABSTRACT

Connection wires connecting signal wires and element-side terminals on a substrate are formed with a plurality of first parts and second parts as connection parts having predetermined widths. Further, by adjusting thicknesses of the plurality of connection parts of the connection wires, or by forming lamination wires on the first parts as the connection parts so as to attain multi-layer structures, the connection wires are arranged so as to have substantially uniform resistances. This allows a difference between a width of the broadest connection wire and a width of the narrowest connection wire to be suppressed so that the former is approximately twice the latter. Consequently, short-circuiting of a broad connection wire and wire-breaking of a narrow wire can be avoided, while the resistances of the connection wires can be made uniform.

23 Claims, 18 Drawing Sheets

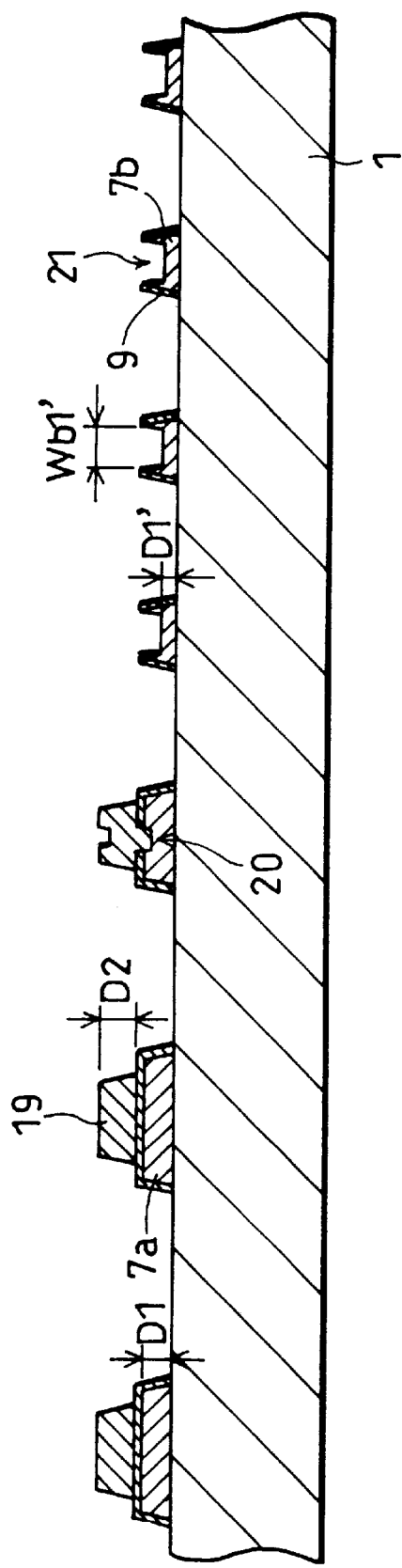

APPARATUS AND METHOD FOR FABRICATING SUBSTRATE OF A LIQUID CRYSTAL DISPLAY DEVICE AND INTERCONNECTS THEREIN

FIELD OF THE INVENTION

The present invention relates to a substrate and a liquid crystal display (LCD) device, and particularly relates to a wire structure of the same and a method for fabricating the same.

BACKGROUND OF THE INVENTION

Recently liquid crystal display (LCD) devices having greater display capacities and higher image quality have been demanded, and LCD devices of active matrix driving type in which switching elements are respectively provided for pixels constituting display screens have been developed in response to the foregoing demand. For example, as the foregoing switching elements, thin film transistor (TFT) elements and metal-insulator-metal (MIM) elements have been turned to practical use.

FIG. 9 illustrates a structure of a liquid crystal cell using MIM elements.

Generally, the liquid crystal cell has a structure consisting of an element substrate 1 and a counter substrate 2 that are made to adhere to each other with a sealing material 16, and liquid crystal is sealed inside to the sealing material 16. Furthermore, to arrange a desired optical system, an optical film such as, for example, a polarizing plate 17 is applied on at least a surface side of the liquid crystal cell.

Furthermore, as shown in FIG. 10, each pixel on the element substrate 1 is composed of a signal wire 3, a MIM element 4, and a pixel electrode 6. The MIM element 4 is composed of a lower electrode 3a, a thin insulator 9 (see FIG. 11(b)) formed so as to cover the lower electrode 3a, and an upper electrode 5, so as to be formed at an intersection of the lower electrode 3a and th e upper electrode 5.

As shown in FIG. 9, to apply signals to the pixels, element-side terminal electrodes 10 are provided on the same surface of the element substrate 1 on that the signal wires 3 (see FIG. 11(a)) are provided, and connection wires 7 are formed so as to connect the signal wires 3 with the element-side terminal electrodes 10. On the counter substrate 2, there are provided counter-side electrodes 14 as well as counter-side terminal electrodes 12 and connection wires 13 for applying signals to the counter-side electrodes 14.

Display of images is carried out by connecting driving-use circuit members 11 and 15 with the element-side terminal electrodes 10 on the element substrate 1 and the counter-side terminal electrodes 12 on the counter substrate 2, and by applying predetermined signals thereto.

The following description will explain a common method for fabricating the element substrate 1 using such MIM elements 4, while referring to FIGS. 11(a) through 11(d).

First of all, as shown in FIG. 11(a), a first conductive material is laminated on a glass substrate by sputtering or the like, and it is patterned to predetermined shapes by photolithography, so that the signal wires 3, the lower electrodes 3a, the connection wires 7, and the element-side terminals 8 should be formed.

Next, as shown in FIG. 11(b), thin insulators 9 are provided at least on surfaces of the lower electrodes 3a. Generally, to form the insulators 9, a method of soaking the element substrate 1 into electrolytic liquid and applying a voltage thereto, that is, so-called anodization, is applied. If upon the anodization the insulators 9 are provided over the element-side terminal electrodes 10, it should be inconvenient, since conduction will not be provided between the element-side terminal electrodes 10 and the circuit member 11 at later stages. Therefore, the following process is applied: the element-side terminal electrodes 8 are covered with protective films such as resin beforehand, and anodization is applied thereto in this state, then, the protective films are removed.

Further, as shown in FIG. 11(c), a second conductive material that will be later formed into the upper electrodes 5 composing the MIM elements 4 is laminated by sputtering or the like, and thereafter it is patterned to predetermined shapes by photolithography.

Finally, as shown in FIG. 11(d), a third conductive material that will be later formed into the pixel electrodes 6 is laminated by sputtering or the like, and thereafter it is patterned to predetermined shapes by photolithography. Incidentally, to ensure reliability of electric connection between the circuit member 11 and the element-side terminals 8, the element-side terminal electrodes 10 are sometimes provided to the element-side terminals 8.

FIGS. 12(a) through 12(d) illustrates another method for fabricating the element substrate 1.

First, as shown in FIG. 12(a), the first conductive material is laminated on a glass substrate by sputtering or the like, and it is patterned to predetermined shapes by photolithography, so that the signal wires 3, the lower electrodes 3a, the connection wires 7, and the element-side terminals 8 should be formed.

Next, as shown in FIG. 12(b), the thin insulators 9 are provided on an entirety of surfaces of the first conductive material by anodization, and through holes 18 are formed by patterning the insulators 9 covering surface of the element-side terminals 8, so that the first conductive material should be exposed through the through holes 18.

Further, as shown in FIG. 12(c), the second conductive material that will be later formed into the upper electrodes 5 composing the MIM elements 4 is laminated by sputtering or the like, and thereafter it is patterned to predetermined shapes by photolithography.

Finally, as shown in FIG. 12(d), the third conductive material that will be later formed into the pixel electrodes 6 is laminated by sputtering or the like, and thereafter, it is patterned to predetermined shapes by photolithography. Incidentally, to ensure reliability of electric connection between the circuit member 11 and the element-side terminals 8, the element-side terminal electrodes 10 are sometimes provided to the element-side terminals 8, like the aforementioned fabrication method.

By either of the foregoing fabrication methods, the insulators 9 that are uniform can be formed since the substrate is not soiled with resin and the like before anodization. Therefore, the foregoing fabrication methods can provide an advantage that the MIM elements 4 having less differences in characteristics can be obtained.

On the other hand, the counter substrate 2 is more easily formed than the element substrate 1 is. For example, after an electrode material is laminated on a glass substrate by sputtering or the like, the counter-side terminal electrodes 12, the connection wires 13, and the counter-side electrodes 14 are simultaneously formed by patterning, whereby the counter substrate 2 is obtained.

Furthermore, the counter substrate 2 occasion ally does not require so fine wiring processing as the element substrate 1 does, and in such a case, patterning of the counter-side terminal electrodes 12, the connection wires 13, and the counter-side electrodes 14 is realized by sputtering of an electrode material with use of deposition masks.

On electrode film surfaces of display areas of the element substrate 1 and the counter substrate 2 thus formed, an alignment film (not shown) is provided. After applying a rubbing operation thereto, the substrates 1 and 2 are combined in a manner such that the electrodes face each other, and is made to adhere to each other with a sealing material 16. Through an opening (not shown) provided at a certain position, liquid crystal is injected by vacuum injection or the like, and is sealed. Thereafter, an optical film such as a polarizing plate 17 is applied over a display surface of the liquid crystal cell, and the circuit member 11 is attached. Thus, an LCD device is completed.

Generally, a liquid crystal cell is fabricated by fabricating a large-size mother glass equivalent to a plurality of liquid crystal cells and by cutting out each liquid crystal cell from the mother glass. Therefore, in the case where the liquid crystal cells have display regions of equal areas to each other, frame regions that are non-display regions and where the element-side terminal electrodes 10 are provided should be made narrower so that. the number of liquid crystal cells obtained from one mother glass could be increased, whereby manufacturing costs can be reduced. It is also demanded to decrease the pitch of terminals of the element-side terminal electrodes 10 as the circuit members are made smaller for reduction of costs.

However, decrease of each space between adjacent terminals and narrowing of the frame regions may make it difficult to form the connection wires. This problem is explained below with reference to FIGS. 13 through 15.

Note that the polarizing plate 17 is not shown in FIGS. 13 through 15.

For example, as shown in FIG. 13, the spaces between connection wires 7 become wide in the case where the pitch of the element-side terminal electrodes 10 is increased. Therefore, in this case hardly occurs the short-circuiting between the connection wires 7 due to remnants of a film of a material of the connection wires 7 after patterning the film to the connection wires 7. Besides, since the lengths of the connection wires 7 do not substantially differ, the connection wires 7 undergo only small differences in resistances.

As shown in FIG. 14, however, spaces between the connection wires 7 are narrowed as the terminal pitch is decreased, thereby possibly causing the short-circuiting of the connection wires 7 due to remnants of the film after patterning. Moreover, since the lengths of the connection wires 7 greatly differ, the differences between resistances of the connection wires 7 increase. In the case where the resistances of the connection wires 7 differ greatly, voltage values applied to the signal wires 3 come to differ from each other even in the case where the same voltage is applied to the element-side terminal electrodes 10, thereby causing shades of display at the pixels to deviate from appropriate ones.

In this case, for example, as means to solve the foregoing problem, the connection wires 7 may be broadened in proportion to the lengths thereof, as shown in FIG. 11(a), so that they should have uniform resistances. This however causes the spaces between long ones among the connection wires 7 that are broadened in width for adjustment of their resistances to have further narrower spaces therebetween, thereby increasing possibility of occurrence of short-circuiting. On the other hand, if short ones among the connection wires 7 are narrowed in width for adjustment of their resistances, possibility of occurrence of wire-breaking increases, and this is also inconvenient.

As shown in FIG. 15, even though the terminal pitch is not decreased, the lengths of the connection wires 7 come to greatly differ in the case where the liquid crystal cell is made smaller in size, and an identical problem to that above described occurs.

Such a problem as non-uniformity of resistances of the connection wires 7 can be solved by using a low-resistance material such as aluminum (resistivity: 4 $\mu\Omega$·cm). This is because use of a low-resistance material not only makes the resistances of the connection wires 7 smaller, but also decrease differences of the resistances of the connection wires 7 due to the differences in their lengths and shapes.

However, the wire material used for forming the connection wires 7 is also the material used for forming the lower electrodes 3a, and therefore, wire materials that can be used for forming the connection wires 7 are limited, to obtain MIM elements 4 having excellent element characteristics. A wire material now put into practical use is only Ta that has a relatively high resistivity (resistivity: about 25 to 20 $\mu\Omega$·cm). Therefore, a material with a low resistivity such as Al (resistivity: 4 $\mu\Omega$·cm) cannot be used for forming the connection wires 7.

Furthermore, broadening the widths of the connection wires 7 to make the resistances of the connection wires 7 uniform not only causes the possibility of short-circuiting to increase, but also occasionally spoils the appearance of the liquid crystal cell. For instance, in a monochrome liquid crystal cell having no color filters and adopting the MIM elements 4 using a light-blocking wire material, regions for the connection wires 7 adjoin pixel regions for the pixel electrodes 6, and directly enter the user's field of vision. Therefore, the wire patterns of the connection wires 7 become awkwardly remarkable.

Thus, the dimensions of the connection wires 7 are limited according to requirements for making the resistances of the wires uniform. On the other hand required is right wiring dimensions that do not cause defect patterns and, in some cases, that do not cause appearance to be spoiled.

In order not to cause wire-breaking of the connection wires 7, a wire width of approximately 10 $\mu$m is required though it depends on performances of manufacturing lines of the liquid crystal cells. Besides, the wires with a wire width of approximately 30 $\mu$m may cause the user to feel uncomfortable though it may depend on individuals. In the liquid crystal cells in these days, a ratio between the length of long ones and the length of short ones among the connection wires 7 not rarely becomes approximately 3:1. Therefore, with the foregoing method in which the width and length of the connection wires 7 are simply adjusted, it is difficult to design the liquid crystal cell so as to make the resistances uniform.

SUMMARY OF THE INVENTION

An object of the present invention is to provide a wire structure, a method for fabricating a substrate, a LCD device, and a method for fabricating the same that can provide uniform resistances of connection wires while avoiding short-circuiting and wire-breaking.

To achieve the foregoing object, a wire structure of the present invention is a wire structure comprising a plurality of connection wires that connect a plurality of signal wires with a plurality of terminals on a substrate, respectively, wherein (i) each of the connection wires has a plurality of connection parts having different cross-sectional structures, respectively, so that the connection parts should have different resistances, and (ii) the plurality of connection parts are arranged so that all the connection wires should have substantially uniform resistances.

The foregoing invention ensures that signal voltages fed through terminals on a substrate are applied to desired signal wires, respectively, through connection wires.

Generally, distances from terminals on a substrate to corresponding signal wires differ from each other, thereby causing resistances of connection wires connecting the terminals with the signal wires to differ from each other. Such differences in resistances lead to irregularities in signal voltages applied to the signal wires that make the signal voltages vary from desired values, thereby causing the reliability to lower. To overcome this problem, devised is an arrangement in which widths of the connection wires are varied so as to make the resistances of the connection wires uniform. However, this leads to the following problem, when the terminal pitch decreases (spaces between terminals become narrower) as circuit integration is further promoted. Namely, it is necessary to make widths of the connection wires different so as to make all the connection wires have uniform resistances, but in the case where the connection wires are long, they are made broader in width, thereby causing short-circuiting to easily occur between adjacent ones of the same. On the other hand, in the case where the connection wires are short, they are made narrower in width, thereby causing wire-breaking to easily occur.

Conversely, according to the foregoing invention, the connection parts are made to have different cross-sectional structures in the thickness direction. In other words, it is possible to make the connection parts have different resistances per unit length in accordance with their cross-sectional structures in the thickness direction, respectively. Thus, by causing the connection parts to have different resistances, respectively, adjustment to make the resistances of the connection wires uniform is enabled. In other words, not by making the widths of the connection wires different, but by making the cross-sectional structures in the thickness direction different, the connection wires are made to have widths in an appropriate range. Consequently, the short-circuiting and wire-breaking occurring to connection wires due to non-uniform widths of the connection wires in the conventional cases can be surely prevented. The cross-sectional structures in the thickness direction can be changed by, for example, changing the thickness of the conductive material layer, or making the layer in a multi-layer structure made of not less than two different conductive materials.

Further, the foregoing plurality of connection parts are provided so that all the connection wires should have substantially uniform resistances. This ensures that resistances are substantially uniform at any terminals. Thus, since the terminals do not undergo differences in resistances, the signal voltages applied to the signal wires do not have irregularities, thereby ensuring that desired signal voltages can be applied to the terminals. Consequently, the reliability of circuit operations is enhanced.

Furthermore, when the predetermined widths of the foregoing plurality of connection parts are equal to each other, the short-circuiting between the connection wires hardly occur as compared with the conventional schemes: in the conventional schemes, the resistances are made substantially uniform between the connection wires by adjusting the wire widths of the connection wires individually; in the present invention, spaces between the connection wires are kept uniform even in the case where the connection wires are laid in a complicated arrangement.

Therefore, the resistances of the connection wires can be easily made uniform, thereby enabling to narrow spaces between the terminals. As a result, circuit members small in size and inexpensive can be used, thereby enabling to lower costs. Furthermore, a higher degree of freedom is allowed in layout of connection wires, and the number of the foregoing substrates obtained from one mother board increases. Consequently, the manufacturing costs as a whole can be surely lowered.

For a fuller understanding of the nature and advantages of the invention, reference should be made to the ensuing detailed description taken in conjunction with the accompanying drawings.

BRIEF DESCRIPTION OF THE DRAWINGS

FIG. 8 is a cross-sectional view taken along a d–d' arrow line in FIG. 7(d).

DESCRIPTION OF THE PREFERRED EMBODIMENTS

Figure 1A:
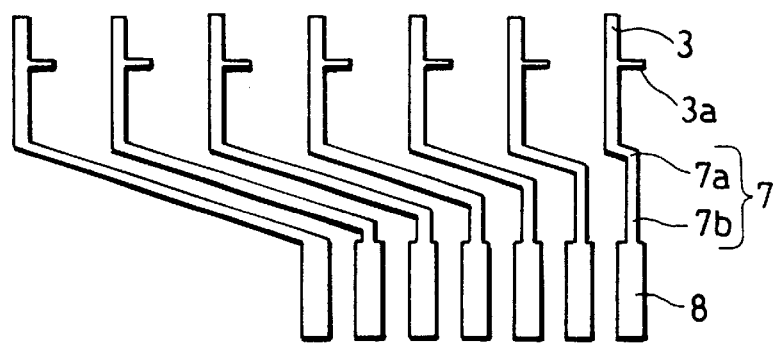
FIGS. 1(a) through 1(d) are explanatory views illustrating a process for fabricating an element substrate having a wire structure in accordance with an embodiment of the present invention.

The following description will explain embodiments of the present invention, while referring to FIGS. 1 through 8 and 16 through 18.

[First Embodiment]

The following description will explain an embodiment of the present invention, while referring to the drawings.

FIGS. 17(a) through 17(d) are explanatory views illustrating respective steps for forming an element substrate 1. FIG. 2 is a cross-sectional view of the element substrate 1 taken along an a–a' arrow line in FIG. 1(d).

First, as shown in FIG. 1(a), Ta as a first conductive material for forming signal wires 3, lower electrodes 3a, connection wires 7, and element-side terminals 8 is laminated on a glass substrate by sputtering and thereafter patterned to predetermined shapes by photolithography.

Here, each of the connection wires 7 has a first part (connection part) 7a and a second part (connection part) 7b, and each connection wire 7 is formed so that a length of the first part 7a should be proportional to a length of an entirety of the connection wire 7. More specifically, as to the connection wire 7 longest in length, its entirety is composed of the first part 7a. On the other hand, as to the connection wire 7 shortest in length, its entirety is composed of the second part 7b.

Figure 1B:
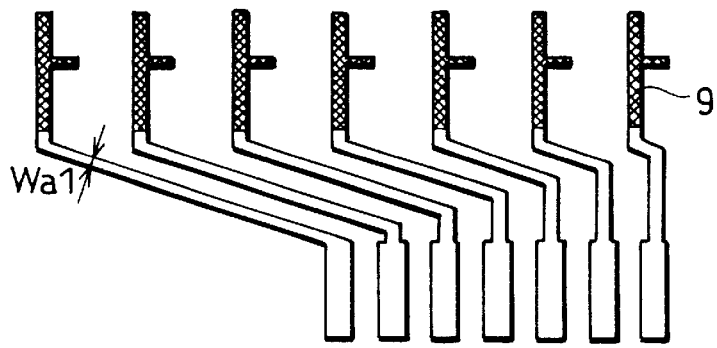

Next, thin insulators 9 are formed on surfaces of the first conductive material. In the present embodiment, anodization is carried out in a state in which not only the element-side terminals 8 but also all the connection wires 7 are covered with protective resin as shown in FIG. 1(b), so that the insulators 9 should be formed exclusively inside pixel regions.

By so doing, Ta can be connected with Ti as second conductive material that will be provided later, throughout the entireties of the first parts 7a. In this case, even with wire-breaking of a lamination wire 19, lamination of Ti on Ta can be ensured at least in a portion of the first part 7a. Therefore, this arrangement sufficiently contributes to the lowering of resistances of the first parts 7a.

Figure 1C:
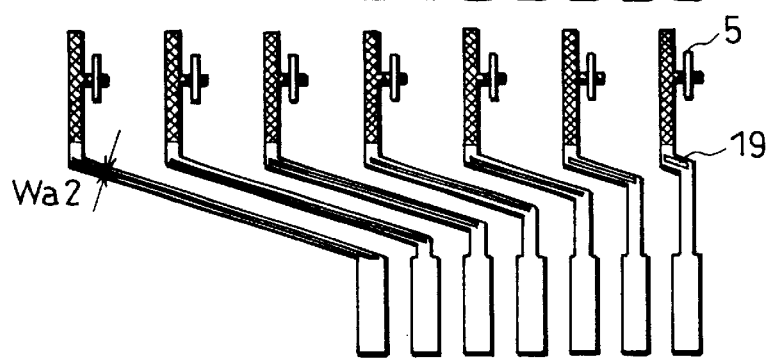

Next, as shown in FIG. 1(c), Ti as the second conductive material is laminated by sputtering and thereafter patterned by photolithography to predetermined shapes, so that upper electrodes 5 are formed. Simultaneously, the lamination wires 19 are also obtained on the surfaces of the first parts 7a by patterning.

Figure 1D:
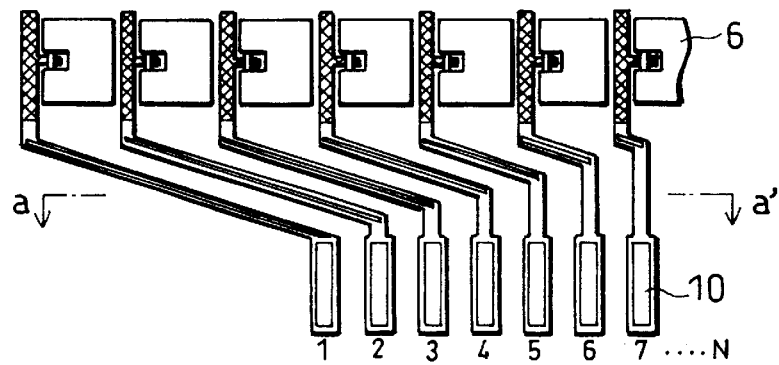
Figure 2:
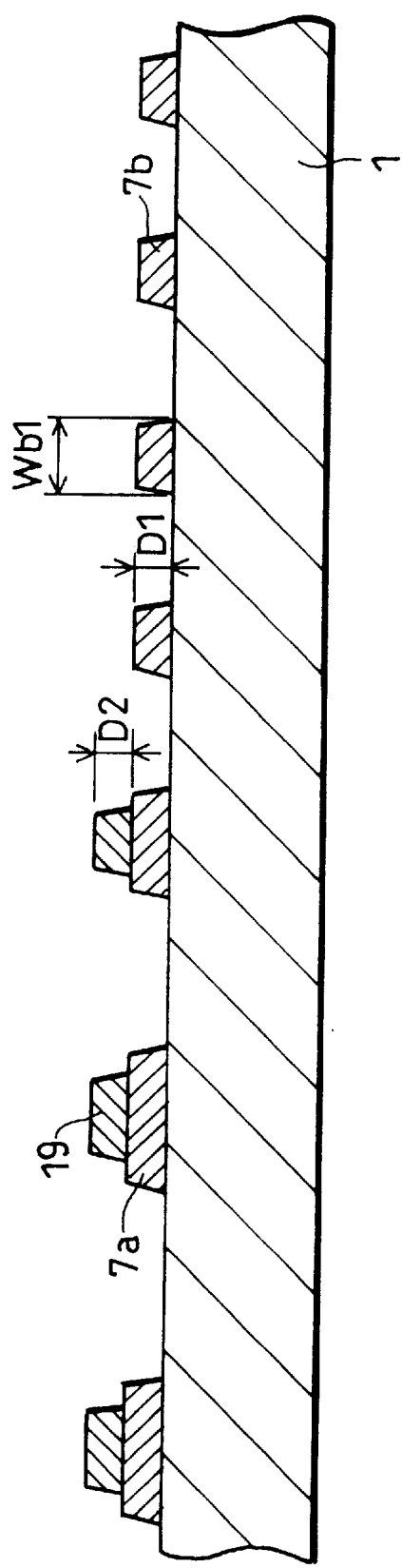
FIG. 2 is a cross-sectional view taken along an a–a' arrow line in FIG. 1(d).

Next, as shown in FIG. 1(d), ITO as a third material that will be formed into pixel electrodes 6 and element-side terminal electrodes 10 is laminated by sputtering and patterned by photolithography to predetermined shapes.

Let the connection wire 7 that is longest having a length of L be the 1st connection wire 7, while let the connection wire 7 that is shortest having a length of l be the N'th connection wire 7. In the foregoing process, the connection wires 7 are formed so that a length $l_a(n)$ and a length $l_b(n)$ that are lengths of the first part 7a and the second part 7b composing the n'th connection wire 7, respectively, should satisfy the following relationship:

$$l_a(n)=L\times(N-n)/(N-1)$$

$$l_b(n)=l\times(n-1)/(N-1)$$

In other words, the connection wire 7 is composed of the first and second parts 7a and 7b, and the connection wire 7 that is the longest (n=1) is entirely composed of the first part 7a, while the connection wire 7 that is the shortest (n=N) is entirely composed of the second part 7b.

Here, a wire resistance $R_a(n)$ of the first part 7a is expressed by the following expression:

$$R_a(n)=R_{a1}(n)\times R_{a2}(n)/(R_{a1}(n)+R_{a2}(n))$$

$$R_{a1}(n)=\rho_1\times l_a(n)/(W_{a1}\times D_1)$$

$$R_{a2}(n)=\rho_2\times l_a(n)/(W_{a2}\times D_2)$$

Further, a wire resistances $R_b(n)$ of the second part 7b is expressed by the following expression:

$$R_b(n)=\rho_1\times l_b(n)/(W_{b1}\times D_1)$$

Therefore, the wire resistance R(n) of the n'th connection wire 7 is expressed by the following expression:

$$R(n)=R_a(n)+R_b(n)$$

Incidentally, the symbols used in the foregoing expressions represent the following:

$R_a(n)$: wire resistance of the first part 7a in the n'th wire;

$R_{a1}(n)$: wire resistance of the first conductive material in the first part 7a in the n'th wire;

$R_{a2}(n)$: wire resistance of the second conductive material in the first part 7a in the n'th wire;

$R_b(n)$: wire resistance of the second part 7b in the n'th wire;

$\rho_1$: resistivity of the first conductive material;

$\rho_2$: resistivity of the second conductive material;

$W_{a1}$: width of the first conductive material in the first part 7a;

$W_{a2}$: width of the second conductive material in the first part 7a;

$W_{b1}$: width of the first conductive material in the second part 7b;

$D_1$: thickness of the first conductive material; and $D_2$: thickness of the second conductive material.

For instance, when L=3(mm) and l=1(mm), concrete values $\rho_1=100(\mu\Omega\cdot cm)$, $\rho_2=120(\mu\Omega\cdot cm)$, $W_{a1}=20(\mu m)$, $W_{a2}=12(\mu m)$, $W_{b1}=11(\mu m)$, $D_1=3000(Å)$, $D_2=4000(Å)$ are substituted in the foregoing expressions so as to calculate $R_a(n)$ and $R_b(n)$ whereby the following are obtained:

$$R_a(n)=300\times(N-n)/(N-1) \quad (\Omega)$$

$$R_b(n)=303\times(n-1)/(N-1) \quad (\Omega)$$

Therefore, R(n) can be expressed by the following expression:

$$R(n)=300\times(N-n)/(N-1)+303\times(n-1)/(N-1) \quad (\Omega)$$

As clear from the above, as to the connection wire 7 that is longest (where n=1), the entirety thereof is composed of the first part 7a having a two-layer structure formed with the first conductive material and the second conductive material, and has a resistance of 300Ω. On the other hand, as to the connection wire 7 that is shortest (where n=N), the entirety thereof is composed of the second part 7b having a single-layer structure formed with the first conductive material, and has a resistance of 303Ω. According to the foregoing expression, R(n) is constant, not varying with the value of n. Thus, the connection wires 7 having cross-sectional structures such that resistances of the connection wires 7 are substantially equal to each other can be provided.

Figure 13:
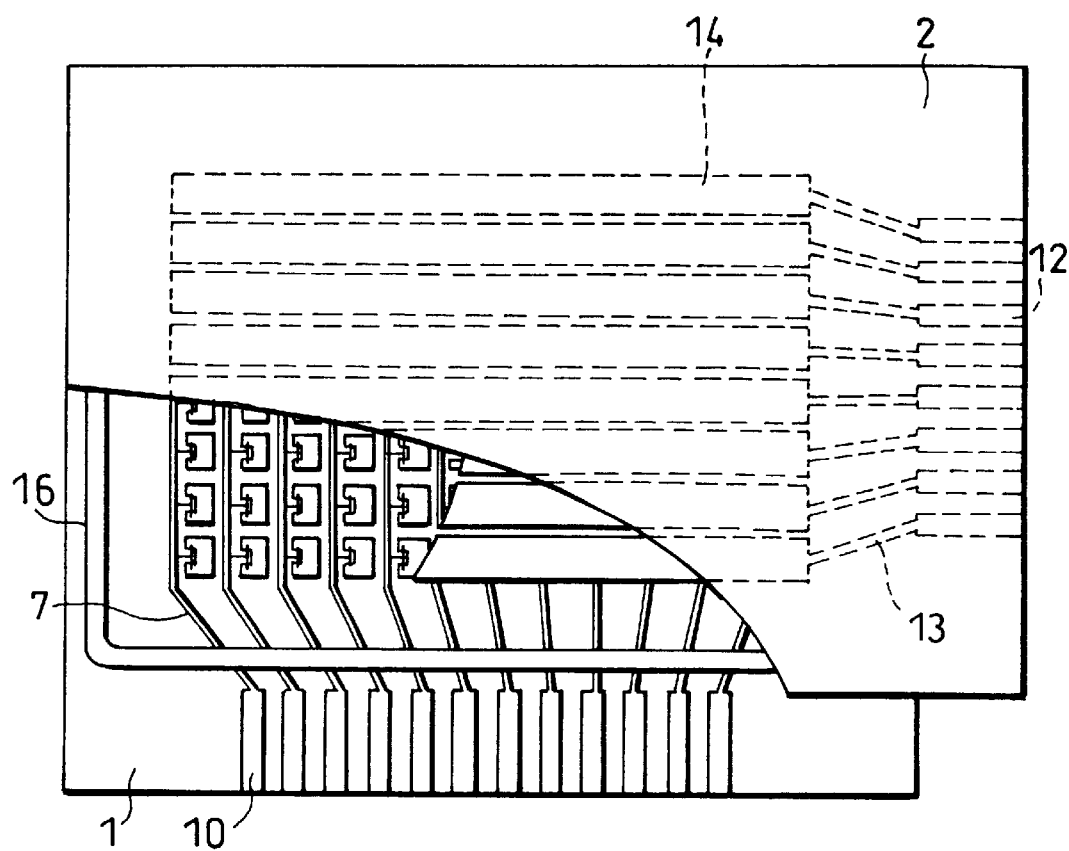
FIG. 13 is a plan view illustrating a conventional liquid crystal cell.
Figure 14:
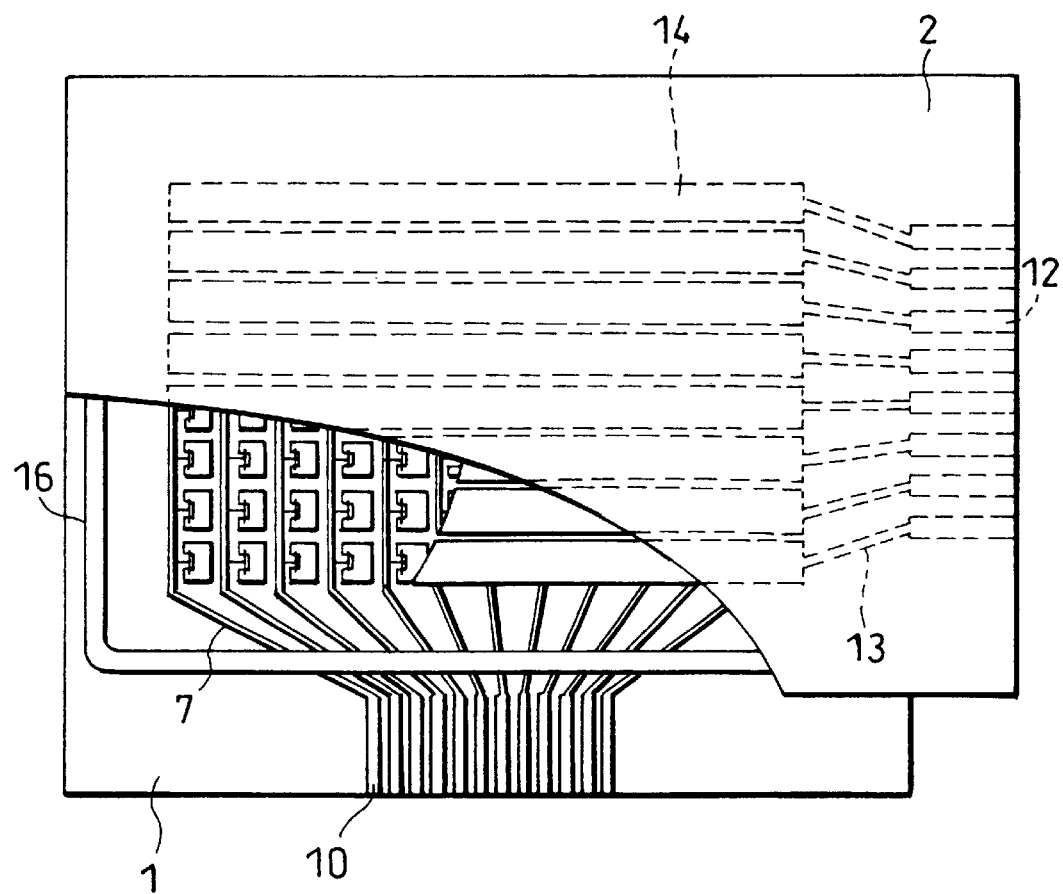
FIG. 14 is a plan view illustrating a conventional liquid crystal cell in which the terminal pitch is decreased.
Figure 15:
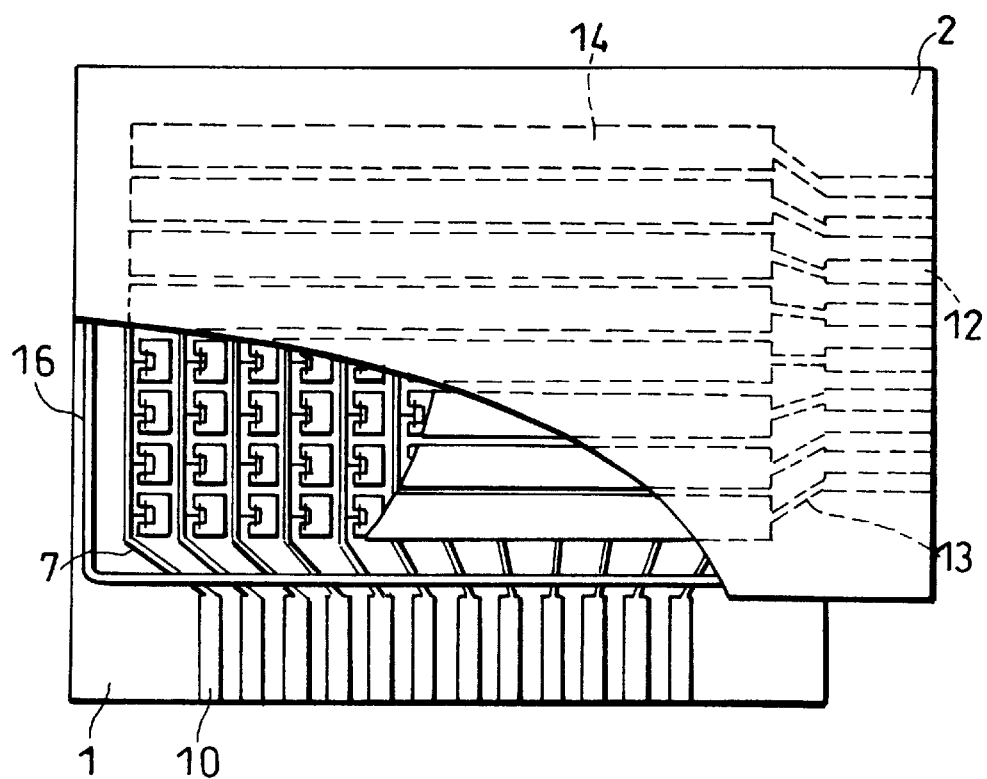
FIG. 15 is a plan view illustrating a conventional liquid crystal cell whose size is reduced.
Figure 16:
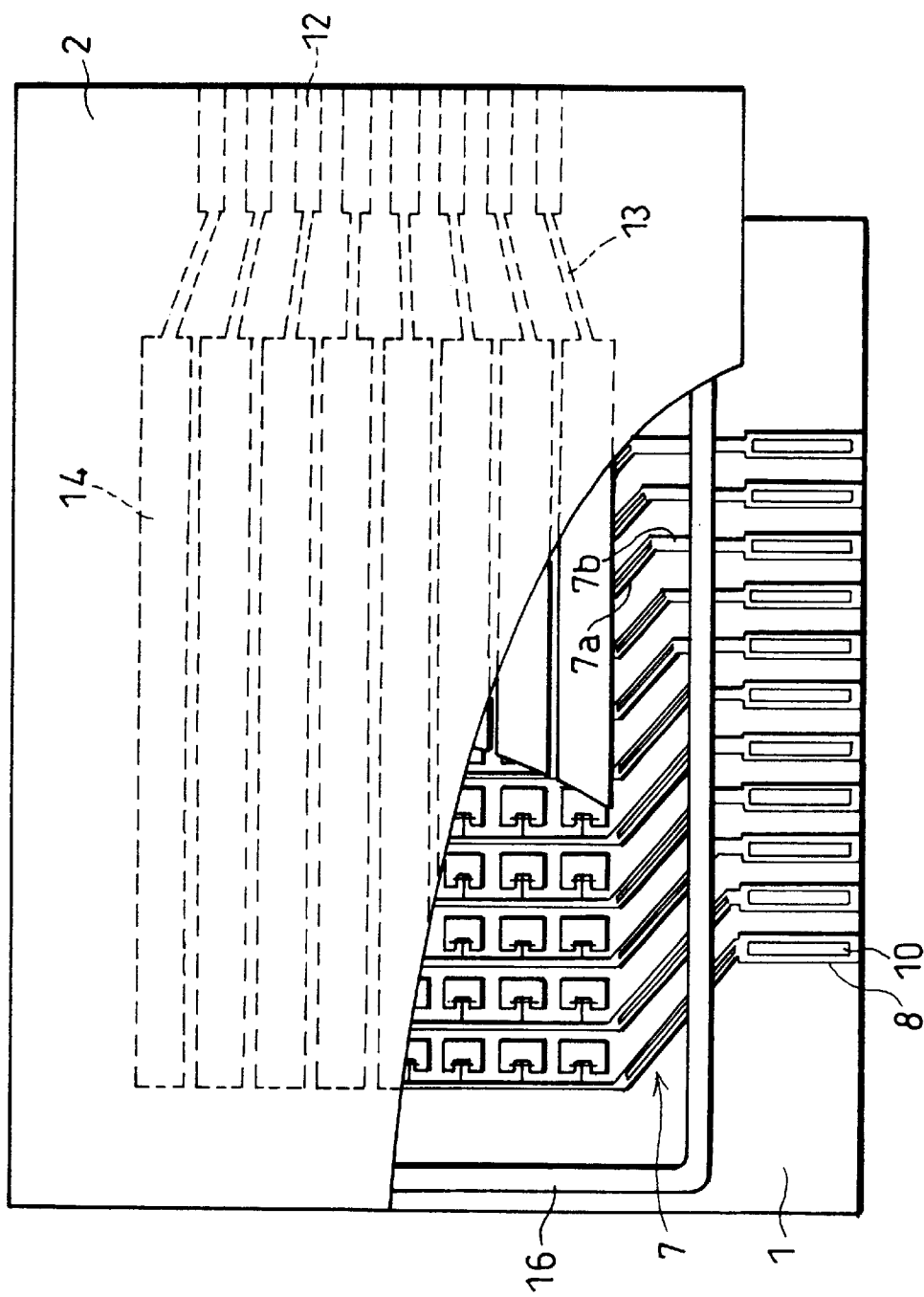
FIG. 16 is a plan view illustrating a liquid crystal cell fabricated through the process shown in FIGS. 1(a) through 1(d).
Figure 17:
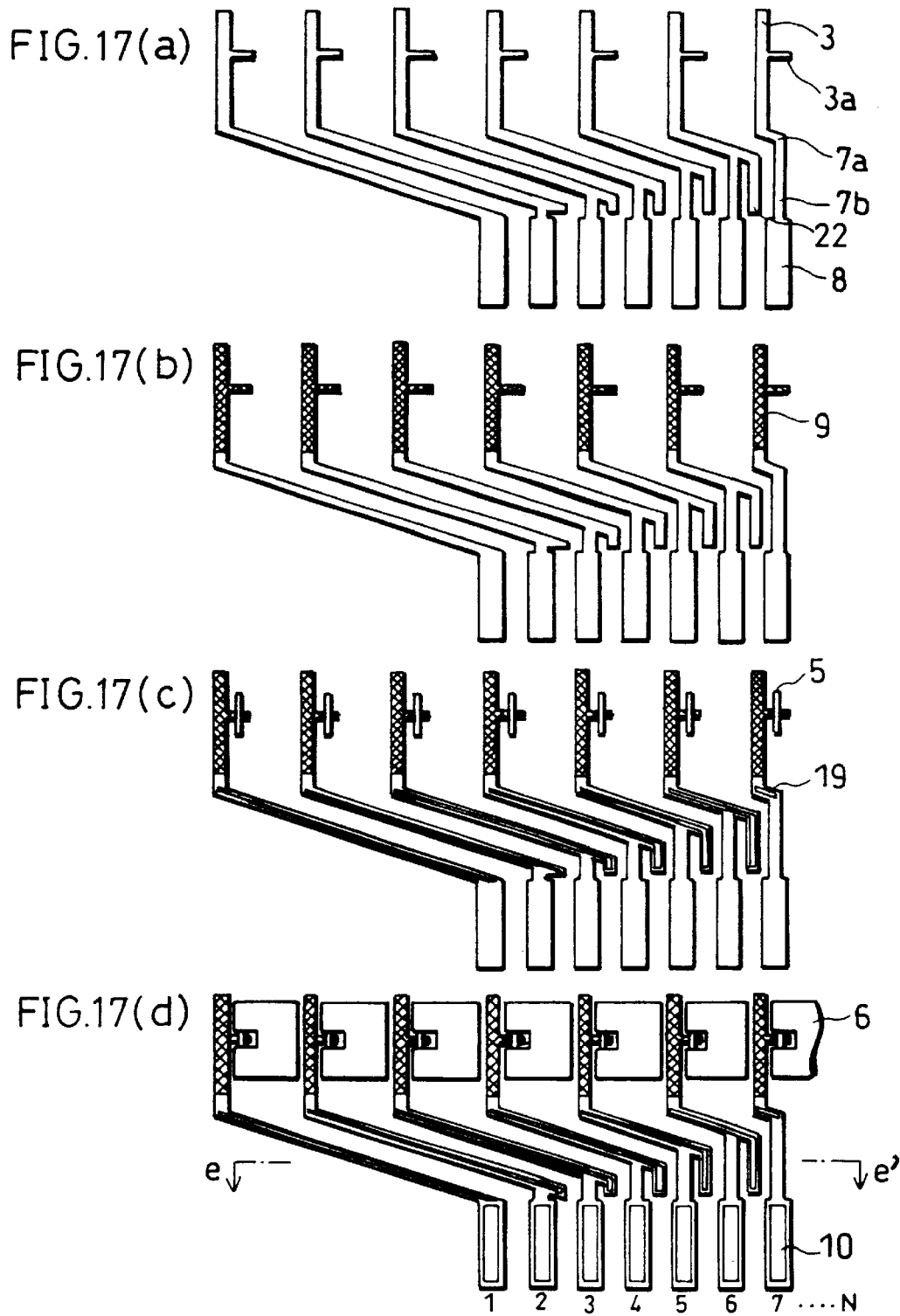
FIGS. 17(a) through 17(d) are explanatory views respectively illustrating steps of a process for fabricating an element substrate in accordance with still another embodiment of the present invention.

An appearance of the liquid crystal cell obtained is shown in FIG. 16. A structure in which the connection wire 7 is composed of the first part 7a and the second part 7b, the first part 7a having a two-layer structure formed with the first conductive material and the second conductive material, the second part 7b having a single-layer structure formed with the first conductive material. In FIG. 16, the third conductive material layers are provided on the element-side terminals 8 so as to be element-side terminal electrodes 10, but the arrangement except that the connection wires 7 and the element-side terminal electrodes 10 is identical to that shown in FIG. 13.

The conventional schemes require to make the width of the broadest connection wire 7 as much as three times the width of the narrowest connection wire 7 since the differences in resistances of the connection wires 7 are eliminated only by adjustment of wire widths. On the contrary, in the present embodiment, the variation in the wire widths can be reduced to a range from 11 $\mu$m where narrowest to 20 $\mu$m where broadest, that is, such that the broadest portion has a width approximately twice that of the narrowest portion. Therefore, all the connection wires 7 are made to have widths limited to a range such that wire-breaking and short-circuiting are suppressed, that is, a range of approximately 10 $\mu$m to 30 $\mu$m, while the resistances of the connection wires 7 are made uniform.

Furthermore, in the present embodiment, the connection wires 7 are made of Ti as the second conductive material that also forms the upper electrodes 5 of the MIM elements 4. Therefore, the present invention can be realized, without adding any step to the conventional MIM element fabricating process shown in FIGS. 11(a) through 11(d), only by changing the photomask used in patterning Ti as the second conductive material. Consequently achieved is an effect that the manufacturing costs are substantially unchanged as compared with the costs in the case of the conventional MIM elements.

Incidentally, it is possible to form the lamination wires 19 with the third conductive material. Generally, however, ITO adopted so as to form the pixel electrodes 6 is relatively thinly laminated so that transmissivity of the liquid crystal cell should be ensured, thereby having a high resistance. Therefore, ITO contributes less to the lowering of resistances of the connection wires 7. Consequently, i n such a case, the lamination wires 19 are preferably formed with the second conductive material as in the present embodiment.

Incidentally, Al, for instance, is adopted as the third conductive material in some cases so as to impart reflectivity to the pixel electrodes 6, so that a LCD device of not a transmission type but a reflection type should be provided. In such a case, the Al layers have an extremely small resistance, since Al has a small resistivity and since it is unnecessary to laminate Al thinly for ensuring transmissivity. Consequently, in such a case, it is effective to adopt the third conductive material so as to form the lamination wires 19.

In other words, selection of either the second conductive material or the third conductive material as a material to form the lamination wires 19 depends on contribution thereof to the lowering of resistances of the wires, and the material of the lamination wires 19 should not be particularly limited to any material.

Thereafter, application of an alignment film and a rubbing treatment are carried out to the substrate 1 as well as the counter substrate 2 that is separately fabricated, and the two substrates are combined so as to adhere to each other. Then, liquid crystal is injected to therebetween. Finally, an optical film and the circuit members 11 and 15 are attached thereto, whereby a LCD device is finished.

As described above, in the present embodiment, a wire structure of a plurality of connection wires 7 that connect signal wires 3 of a liquid crystal cell with terminals (element-side terminals 8) on an element substrate 1 on which two-terminal non-linear elements (MIM elements 4) composed of lower electrodes 3a, insulators 9, and upper electrodes 5 are formed, is arranged so that each of the connection wires 7 has a plurality of connection parts (first parts 7a and second parts 7b) having predetermined widths, and the plurality of connection parts are arranged so that all the connection wires should have substantially uniform resistances. This arrangement enables to avoid short-circuiting and wire-breaking, while enables to make the resistances of the connection wires 7 uniform.

[Second Embodiment]

The following description will explain another embodiment of the present invention, while referring to the drawings.

FIGS. 3(a) through 3(d) are explanatory views respectively illustrating steps of fabricating the element substrate 1. FIG. 4 is a cross-sectional view of the substrate taken along a b–b' arrow line in FIG. 3(d).

Figure 3A:
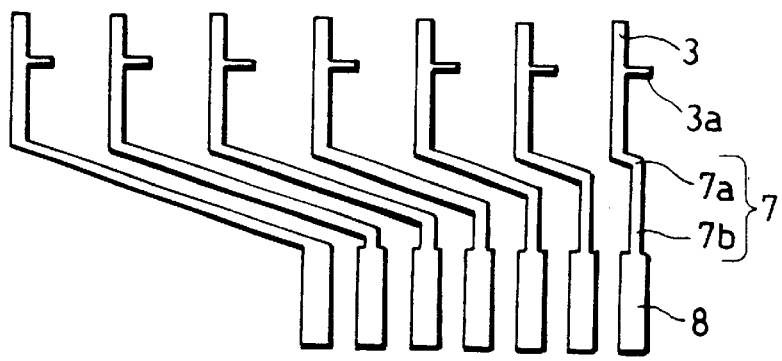
FIGS. 3(a) through 3(d) are explanatory views illustrating a process for fabricating an element substrate having a wire structure in accordance with another embodiment of the present invention.
Figure 4:
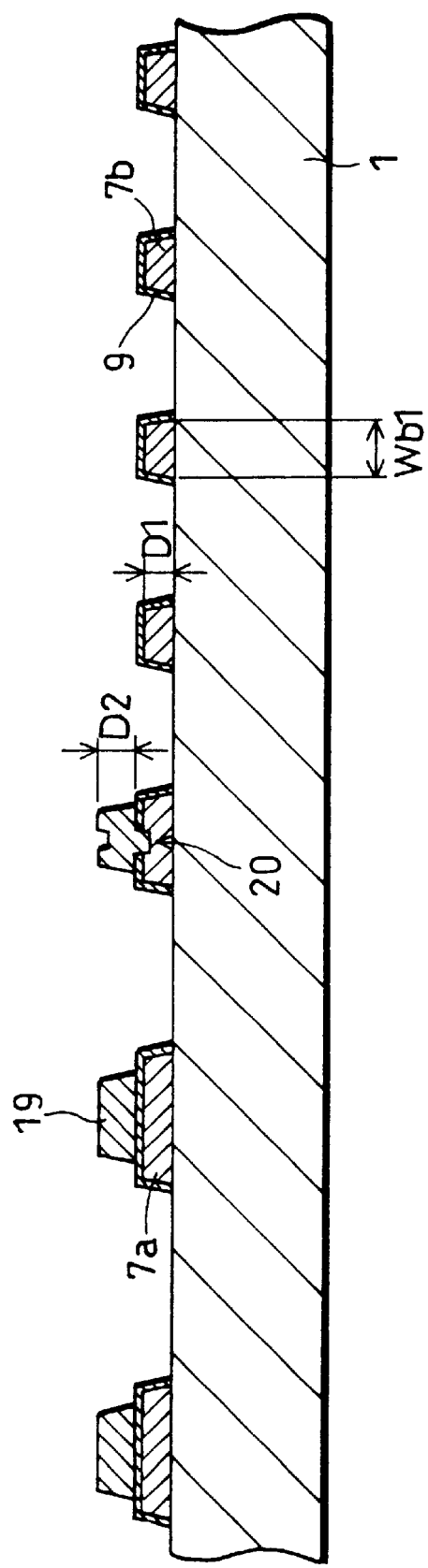
FIG. 4 is a cross-sectional view taken along a b–b' arrow line in FIG. 3(d).
Figure 5:
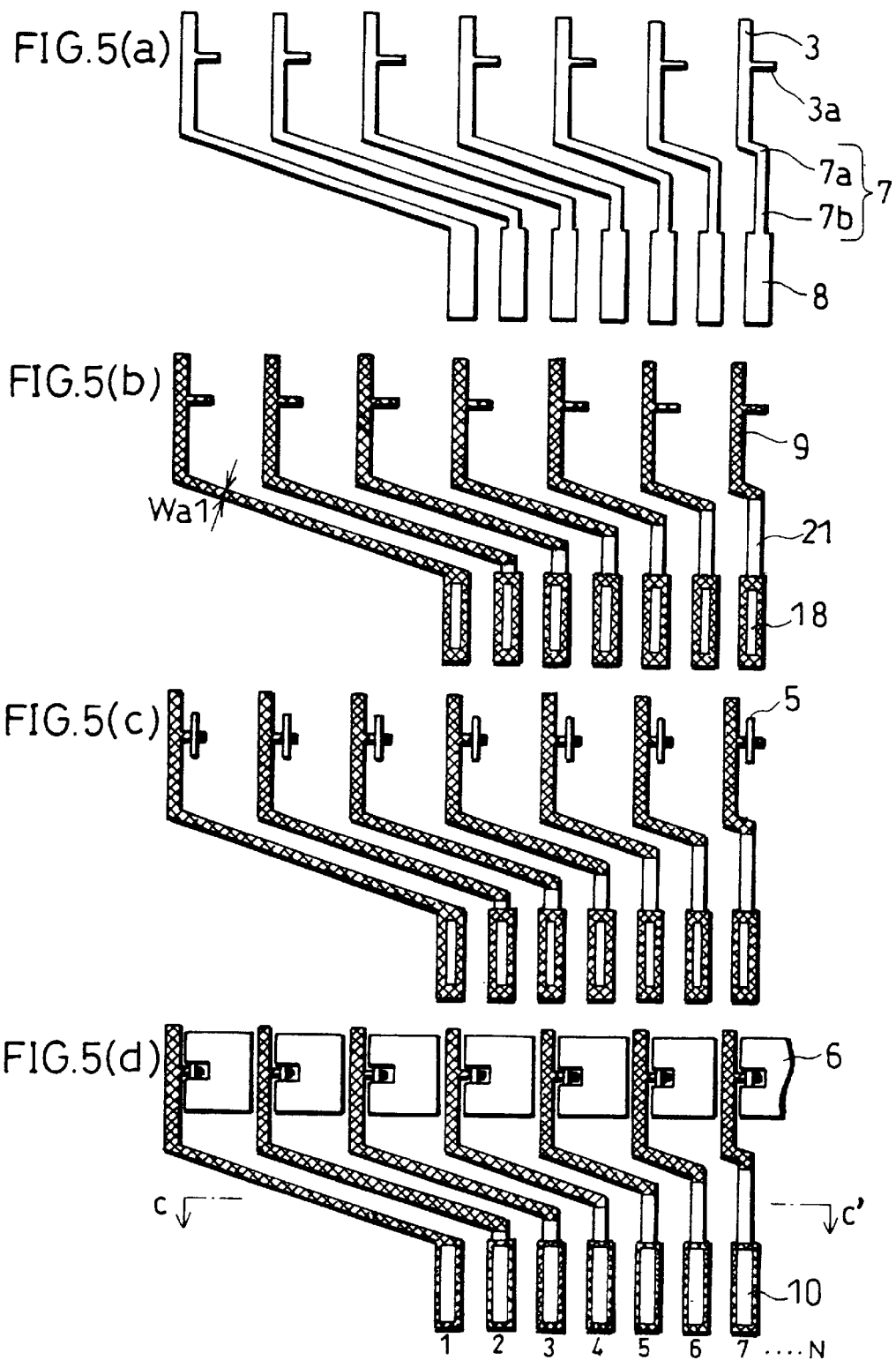
FIGS. 5(a) through 5(d) are explanatory views illustrating a process for fabricating an element substrate having a wire structure in accordance with still another embodiment of the present invention.

First of all, as shown in FIG. 3(a), Ta as the first conductive material for forming signal wires 3, lower electrodes 3a, connection wires 7, and element-side terminals 8 is laminated on a glass substrate by sputtering and thereafter patterned to predetermined shapes by photolithography.

Here, each of the connection wires 7 has a first part 7a and a second part 7b, and each connection wire 7 is formed so that a length of the first part 7a should be proportional to a length of an entirety of the connection wire 7. More specifically, as to the connection wire 7 longest in length, the entirety thereof is composed of the first part 7a. on th e other hand, as to the connection wire 7 shortest in length, the entirety thereof is composed of the second part 7b.

Figure 3B:
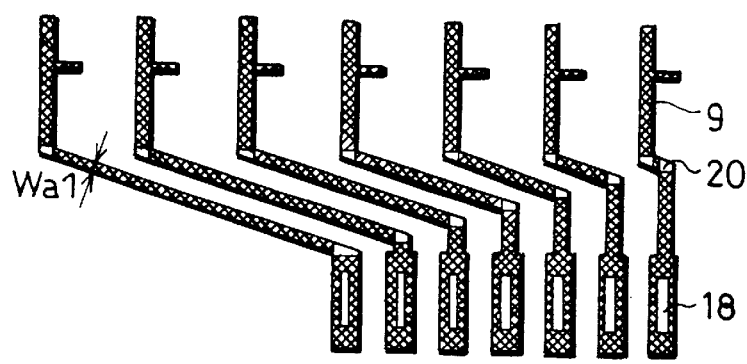

Next, a thin insulator 9 is formed over an entirety of each surface of Ta as the first conductive material. In the present embodiment, the insulators 9 are formed by anodization. After the formation of the insulators 9, through holes 18 are formed in the layer of each insulator 9 by photolithography as shown in FIG. 3(b), so that Ta as the first conductive material should be exposed there, to provide conduction of the lower electrodes 3a and the element-side terminal electrodes 10 with upper layers that are to be later provided. Simultaneously, through holes 20 are formed in the layer of each insulator 9 at at least two positions on both ends of each first part 7a, so that surfaces of Ta should be exposed there.

Figure 3C:
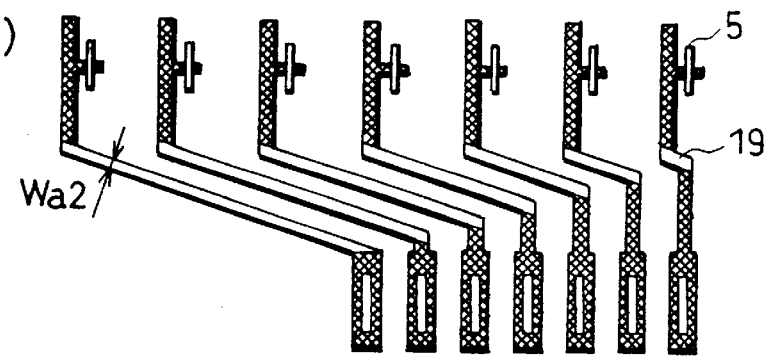

Next, as shown in FIG. 3(c), Ti as the second conductive material is laminated thereon by sputtering and thereafter patterned to predetermined shapes by photolithography, so that the upper electrodes 5 should be formed. Simultaneously, the lamination wires 19 are also formed by the patterning on surfaces of the first parts 7a. As a result, Ta as the first conductive material and Ti as the second conductive material are connected via the through holes 20 in the insulators 9.

Thus, in the case where the connecting method via the through holes 20 is used, Ta as the first conductive material is protected by the insulators 9. Therefore, the following effect can be achieved: namely, a problem such that Ta in the first parts 7a is thinned upon etching the upper layers thereby having greater resistances can be prevented.

Figure 3D:
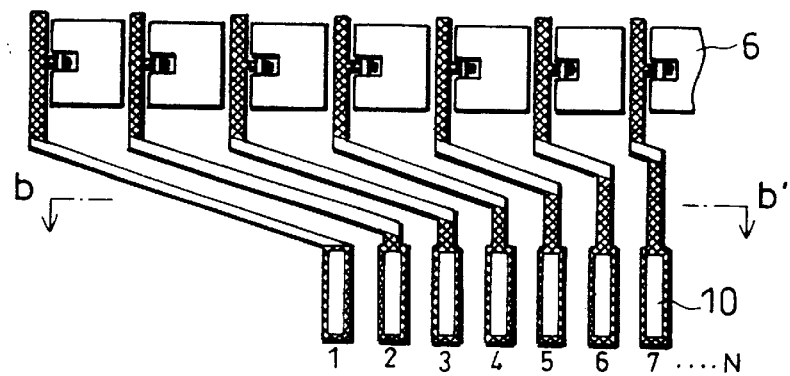

Next, as shown in FIG. 3(d), ITO as the third conductive material that is formed into the pixel electrodes 6 and the element-side terminal electrodes 10 is laminated thereon by sputtering and thereafter patterned to predetermined shapes by photolithography.

Let the connection wire 7 that is longest having a length of L be the 1st connection wire 7, while let the connection wire 7 that is shortest having a length of 1 be the N'th connection wire 7. In the foregoing process, the connection wires 7 are formed so that a length $l_a(n)$ and a length $l_b(n)$ that are lengths of the first part 7a and the second part 7b composing the n'th connection wire, respectively, should satisfy the following relationship:

$$l_a(n) = L \times (N-n)/(N-1)$$

$$l_b(n) = l \times (n-1)/(N-1)$$

In other words, the connection wire 7 is composed of the first and second parts 7a and 7b, and the connection wire 7 that is the longest (n=1) is entirely composed of the first part 7a, while the connection wire 7 that is the shortest (n=N) is entirely composed of the second part 7b.

Here, a wire resistance $R_a(n)$ of the first part 7a is expressed by the following expression:

$$R_a(n) = R_{a1}(n) \times R_{a2}(n)/(R_{a1}(n) + R_{a2}(n))$$

$$R_{a1}(n) = \rho_1 \times l_a(n)/(W_{a1} \times D_1)$$

$$R_{a2}(n) = \rho_2 \times l_a(n)/(W_{a2} \times D_2)$$

Further, a wire resistances $R_b(n)$ of the second part 7b is expressed by the following expression:

$$R_b(n) = \rho_1 \times l_b(n)/(W_{b1} \times D_1)$$

Therefore, the wire resistance R(n) of the n'th connection wire 7 is expressed by the following expression:

$$R(n) = R_a(n) + R_b(n)$$

Incidentally, the symbols used in the foregoing expressions represent the following:

$R_a(n)$: wire resistance of the first part 7a in the n'th wire;

$R_{a1}(n)$: wire resistance of the first conductive material in the first part 7a in the n'th wire;

$R_{a2}(n)$: wire resistance of the second conductive material in the first part 7a in the n'th wire;

$R_b(n)$: wire resistance of the second part 7b in the n'th wire;

$\rho_1$: resistivity of the first conductive material;

$\rho_2$: resistivity of the second conductive material;

$W_{a1}$: width of the first conductive material in the first part 7a;

$W_{a2}$: width of the second conductive material in the first part 7a;

$W_{b1}$: width of the first conductive material in the second part 7b;

$D_1$: thickness of the first conductive material; and $D_2$: thickness of the second conductive material.

For instance, when L=3(mm) and l=1(mm), concrete values $\rho_1=100(\mu\Omega\cdot cm)$, $\rho_2=120(\mu\Omega\cdot cm)$, $W_{a1}=20(\mu m)$, $W_{a2}=12(\mu m)$, $W_{b1}=11(\mu m)$, $D_1=3000(\text{Å})$, $D_2=4000(\text{Å})$ are substituted in the foregoing expressions so as to calculate $R_a(n)$ and $R_b(n)$, whereby the following are obtained:

$$R_a(n) = 300 \times (N-n)/(N-1) \quad (\Omega)$$

$$R_b(n) = 303 \times (n-1)/(N-1) \quad (\Omega)$$

Therefore, R(n) can be expressed by the following expression:

$$R(n) = 300 \times (N-n)/(N-1) + 303 \times (n-1)/(N-1) \quad (\Omega)$$

As clear from the above, as to the connection wire 7 that is longest (where n=1), the entirety thereof is composed of the first part 7a having a two-layer structure formed with the first conductive material and the second conductive material, and has a resistance of 300Ω. On the other hand, as to the connection wire 7 that is shortest (where n=N), the entirety thereof is composed of the second part 7b having a single-layer structure formed with the first conductive material, and has a resistance of 303Ω. According to the foregoing expression, R(n) is constant, not varying with the value of n. Thus, the connection wires 7 having cross-sectional structures such that resistances of the connection wires 7 are substantially equal to each other can be provided.

The conventional schemes require to make the width of the broadest connection wire 7 three times the width of the narrowest connection wire 7 since the differences in resistances of the connection wires 7 are eliminated only by adjustment of wire widths. On the contrary, in the present embodiment, the variation in the wire widths can be reduced to a range from 11 μm where narrowest to 20 μm where broadest, that is, such that the broadest portion has a width approximately twice that of the narrowest portion. Therefore, all the connection wires 7 are made to have widths limited to a range such that wire-breaking and short-circuiting are suppressed, that is, a range of approximately 10 μm to 30 μm, while the resistances of the connection wires 7 are made uniform.

Furthermore, in the present embodiment, the connection wires 7 are made of Ti as the second conductive material that also forms the upper electrodes 5 of the MIM elements 4. Therefore, the present invention can be realized, without adding any step to the conventional MIM element fabricating process shown in FIGS. 12(a) through 12(d), only by changing the photomask used for forming the through holes 20 and the photomask used in patterning Ti as the second conductive material. Consequently achieved is an effect that the manufacturing costs are substantially unchanged as compared with the costs in the case of the conventional MIM elements.

Incidentally, Ta as the first conductive material and Ti as the second conductive material are connected with each other through the through holes 20 provided at two positions in each insulator 9, but the through holes 20 may be provided at not less than three positions in each insulator 9, so that the effect of lowering the resistances of the connection wires 7 should not be cancelled by wire-breaking of the lamination wires 19.

Provision of a large rectangular through hole 20 over each insulator 9, however, may cause over-etching upon etching the insulator 9, thereby removing Ta as the first conductive material too deeply, and consequently, the resistance of the Ta layer may increase. Therefore, as in the present embodiment, the minimum number of the through holes 20 are preferably provided, each in the minimum size.

Incidentally, the through holes may be provided on the surfaces of the signal wires 3 and Ti as the second conductive material may be laminated thereon, so that the lowering of resistances of the signal wires 3 should be also achieved.

Incidentally, it is possible to form the lamination wires 19 with the third conductive material. Generally, however, ITO adopted so as to form the pixel electrodes 6 is relatively thinly laminated so that transmissivity of the liquid crystal cell should be ensured, thereby having a high resistance. Therefore, ITO contributes less to the lowering of resistances of the connection wires 7. Consequently, in such a case, the lamination wires 19 are preferably formed with the second conductive material as in the present embodiment.

Incidentally, Al, for instance, is adopted as the third conductive material in some cases so as to impart reflectivity to the pixel electrodes 6, so that a LCD device of not a transmission type but a reflection type is provided. In such a case, the Al layers have an extremely small resistance, since Al has a small resistivity and since it is unnecessary to laminate Al thinly for ensuring transmissivity. Consequently, in such a case, it is effective to adopt the third conductive material so as to form the lamination wires 19.

In other words, selection of either the second conductive material or the third conductive material as a material to form the lamination wires 19 depends on contribution thereof to the lowering of resistances of the wires, and the material of the lamination wires 19 should not be particularly limited to any material.

Thereafter, application of an alignment film and a rubbing treatment are carried out to the substrate 1 as well as the counter substrate 2 that is separately fabricated, and the two substrates are combined so as to adhere to each other. Then, liquid crystal is injected to therebetween. Finally, an optical film and the circuit members 11 and 15 are attached thereto, whereby a LCD device is finished.

As described above, in the present embodiment, a wire structure of a plurality of connection wires 7 that connect signal wires 3 of a liquid crystal cell with terminals (element-side terminals 8) on an element substrate 1 on which two-terminal non-linear elements (MIM elements 4) composed of lower electrodes 3a, insulators 9, and upper electrodes 5 are formed, is arranged so that each of the connection wires 7 has a plurality of connection parts (first parts 7a and second parts 7b) having predetermined widths, and the plurality of connection parts have a multi-layer structure made of a plurality of conductive materials so that all the connection wires should have substantially uniform resistances. This arrangement enables to avoid short-circuiting and wire-breaking, while enables to make the resistances of the connection wires 7 uniform.

[Third Embodiment]

The following description will explain still another embodiment of the present invention, while referring to the drawings.

Figure 6:
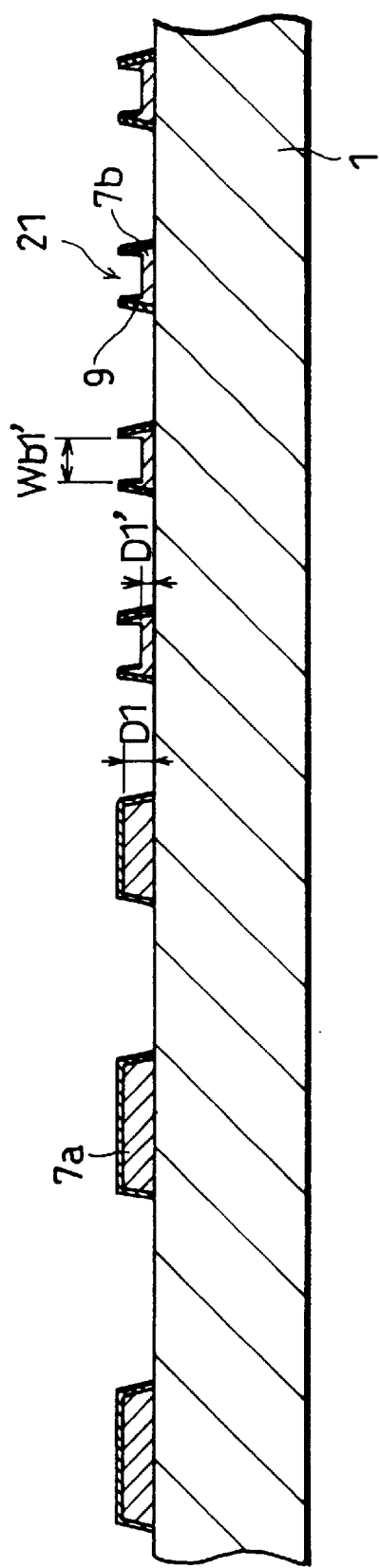
FIG. 6 is a cross-sectional view taken along a c–c' arrow line in FIG. 5(d).

FIGS. 5(a) through 5(d) are explanatory views respectively illustrating steps of fabricating the element substrate 1. FIG. 6 is a cross-sectional view of the substrate taken along a c–c' arrow line in FIG. 5(d).

First of all, as shown in FIG. 5(a), Ta as a first conductive material for forming signal wires 3, lower electrodes 3a, connection wires 7, and element-side terminals 8 is laminated on a glass substrate by sputtering and thereafter patterned to predetermined shapes by photolithography.

Here, each of the connection wires 7 has a first part 7a and a second part 7b, and each connection wire 7 is formed so that a length of the first part 7a should be proportional to a length of an entirety of the connection wire 7. More specifically, as to the connection wire 7 longest in length, the entirety thereof is composed of the first part 7a. On the other hand, as to the connection wire 7 shortest in length, the entirety thereof is composed of the second part 7b.

Next, a thin insulator 9 is formed over an entirety of each surface of Ta as the first conductive material. In the present embodiment, the insulators 9 are formed by anodization. After the formation of the insulators 9, through holes 18 are formed in the layer of each insulator 9 by photolithography as shown in FIG. 5(b), so that Ta as the first conductive material should be exposed there, to provide conduction of the element-side terminal electrodes 10 with upper layers that are to be later provided. Simultaneously, a through hole 21 in a rectangular shape is provided in each second part 7b, so that the insulator 9 should be removed from each through hole 21, and the etching is further continued so that Ta should be thinned.

Next, as shown in FIG. 5(c), Ti as the second conductive material is laminated thereon by sputtering and thereafter patterned to predetermined shapes by photolithography, so that the upper electrodes 5 are formed.

Next, as shown in FIG. 5(d), ITO as the third conductive material for forming the pixel electrodes 6 and the element-side terminal electrodes 10 is laminated thereon by sputtering and thereafter patterned to predetermined shapes by photolithography.

Let the connection wire 7 that is longest having a length of L be the 1st connection wire 7, while let the connection wire 7 that is shortest having a length of 1 be the N'th connection wire 7. In the foregoing process, the connection wires 7 are formed so that a length $l_a(n)$ and a length $l_b(n)$ that are lengths of the first part 7a and the second part 7b composing the n'th connection wire, respectively, should satisfy the following relationship:

$$l_a(n)=L\times(N-n)/(N-1)$$

$$l_b(n)=l\times(n-1)/(N-1)$$

In other words, the connection wire 7 is composed of the first and second parts 7a and 7b, and the connection wire 7 that is the longest (n=1) is entirely composed of the first part 7a, while the connection wire 7 that is the shortest (n=N) is entirely composed of the second part 7b.

Here, a wire resistances $R_a(n)$ of the first part 7a is expressed by the following expression:

$$R_a(n)=\rho_1\times l_a(n)/(W_{a1}\times D_1)$$

Further, a wire resistances $R_b(n)$ of the second part 7b is expressed by the following expression:

$$R_b(n)=R_{b1}(n)\times R_{b1'}(n)/(R_{b1}(n)+R_{b1'}(n))$$

$$R_{b1}(n)=\rho_1\times l_b(n)/(W_{b1}\times D_1)$$

$$R_{b1'}(n)=\rho_1\times l_b(n)/(W_{b1'}\times D_{1'})$$

Therefore, the wire resistance R(n) of the n'th connection wire 7 is expressed by the following expression:

$$R(n)=R_a(n)+R_b(n)$$

Incidentally, the symbols used in the foregoing expressions represent the following:

$R_a(n)$: wire resistance of the first part 7a in the n'th wire;

$R_b(n)$: wire resistance of the second part 7b in the n'th wire;

$R_{b1}(n)$: wire resistance of the thick first conductive material in the second part 7b in the n'th wire;

$R_{b1'}(n)$: wire resistance of the thin first conductive material in the second part 7b in the n'th wire;

$\rho_1$: resistivity of the first conductive material;

$W_{a1}$: width of the first conductive material in the first part 7a;

$W_{b1}$: width of the thick first conductive material in the second part 7b;

$W_{b1'}$: width of the thin first conductive material in the second part 7b;

$D_1$: thickness of the thick first conductive material; and $D_{1'}$: thickness of the thin first conductive material.

For instance, when L=3(mm) and l=1(mm), concrete values $\rho_1$=100($\mu\Omega\cdot$cm), $W_{a1}$=20($\mu$m), $W_{b1}$=5($\mu$m), $W_{b1'}$=5 ($\mu$m), $D_1$=3000(Å), $D_{1'}$=1000(Å) are substituted in the foregoing expressions so as to calculate $R_a(n)$ and $R_b(n)$, whereby the following are obtained:

$$R_a(n)=500\times(N-n)/(N-1) \quad (\Omega)$$

$$R_b(n)=500\times(n-1)/(N-1) \quad (\Omega)$$

Therefore, R(n) can be expressed by the following expression:

$$R(n)=500\times(N-n)/(N-1)+500\times(n-1)/(N-1) \quad (\Omega)$$

As clear from the above, as to the connection wire 7 that is longest (where n=1), the entirety thereof is composed of the first part 7a formed with the first conductive material in a thickness that has been substantially unchanged from the thickness upon the film formation, and has a resistance of 500Ω. On the other hand, as to the connection wire 7 that is shortest (where n=N), the entirety thereof is composed of the second part 7b formed with the first conductive material that has been thinned, and has a resistance of 500Ω. According to the foregoing expression, R(n) is constant, not varying with the value of n. Thus, the connection wires 7 having cross-sectional structures such that resistances of the connection wires 7 are substantially equal to each other can be provided.

In the case where a film with a uniform thickness is formed with a single material, the conventional schemes require to make the width of the broadest connection wire 7 three times the width of the narrowest connection wire 7 since the differences in resistances of the connection wires 7 are eliminated only by adjustment of wire widths. On the contrary, in the present embodiment, the variation in the wire widths can be reduced to a range from 10 $\mu$m where narrowest to 20 $\mu$m where broadest, that is, such that the broadest portion has a width approximately twice that of the narrowest portion. Therefore, all the connection wires 7 are made to have widths limited to a range such that wire-breaking and short-circuiting are suppressed, that is, a range of approximately 10 $\mu$m to 30 $\mu$m, while the resistances of the connection wires 7 are made uniform.

Furthermore, in the present embodiment, the connection wires 7 are made of Ti as the second conductive material that also forms the upper electrodes 5 of the MIM elements 4. Therefore, the present invention can be realized, without adding any step to the conventional MIM element fabricating process shown in FIGS. 12(a) through 12(d), only by changing the photomask used for forming the through holes 21. Consequently achieved is an effect that the manufacturing costs are substantially unchanged as compared with the costs in the case of the conventional MIM elements.

Thereafter, application of an alignment film and a rubbing treatment are carried out to the substrate 1 as well as the counter substrate 2 that is separately fabricated, and the two substrates are combined so as to adhere to each other. Then, liquid crystal is injected to therebetween. Finally, an optical film and the circuit members 11 and 15 are attached thereto, whereby a LCD device is finished.

As described above, in the present embodiment, a wire structure of a plurality of connection wires 7 that connect signal wires 3 of a liquid crystal cell with terminals (element-side terminals 8) on an element substrate 1 on which two-terminal non-linear elements (MIM elements 4) composed of lower electrodes 3a, insulators 9, and upper electrodes 5 are formed, is arranged so that the connection wires 7 are composed of first and second connection parts (first parts 7a and second parts 7b), each of the first connection parts having a single-layer structure made of a single conductive material in a predetermined width, each of the second connection parts having a single-layer structure made of another single conductive material in a predetermined width, a length of each first connection part increasing according to a length of the connection wire 7 that the first connection part belongs to, and (ii) the first connection part is thicker than the second connection part, and thicknesses of the first and second connection parts are set so that all the connection wires 7 should have uniform resistances. This arrangement enables to avoid short-circuiting and wire-breaking, while enables to make the resistances of the connection wires 7 uniform.

[Fourth Embodiment]

The following description will explain still another embodiment of the present invention, while referring to the drawings.

FIGS. 7(a) through 7(d) are explanatory views respectively illustrating steps of fabricating the element substrate 1. FIG. 8 is a cross-sectional view of the substrate taken along a d–d' arrow line in FIG. 7(d).

Figure 7A:
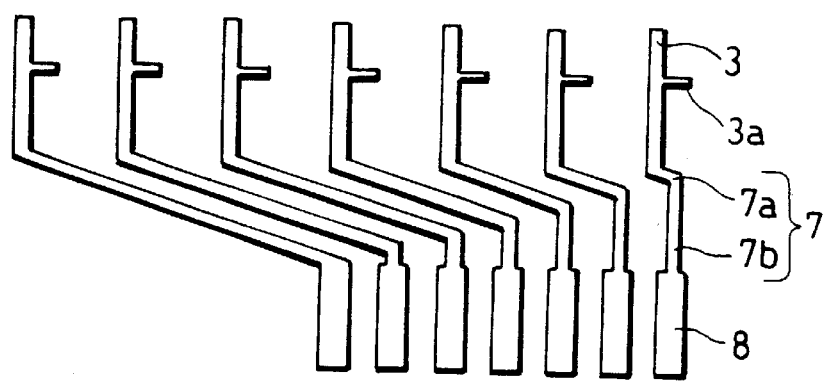
FIGS. 7(a) through 7(d) are explanatory views illustrating a process for fabricating an element substrate having a wire structure in accordance with still another embodiment of the present invention.

First of all, as shown in FIG. 7(a), Ta as a first conductive material for forming signal wires 3, lower electrodes 3a, connection wires 7, and element-side terminals 8 is laminated on a glass substrate by sputtering and thereafter patterned to predetermined shapes by photolithography.

Here, each of the connection wires 7 has a first part 7a and a second part 7b, and each connection wire 7 is formed so that a length of the first part should be proportional to a length of an entirety of the connection wire 7. More specifically, as to the connection wire 7 longest in length, the entirety thereof is composed of the first part 7a. On the other hand, as to the connection wire 7 shortest in length, the entirety thereof is composed of the second part.

Figure 7B:
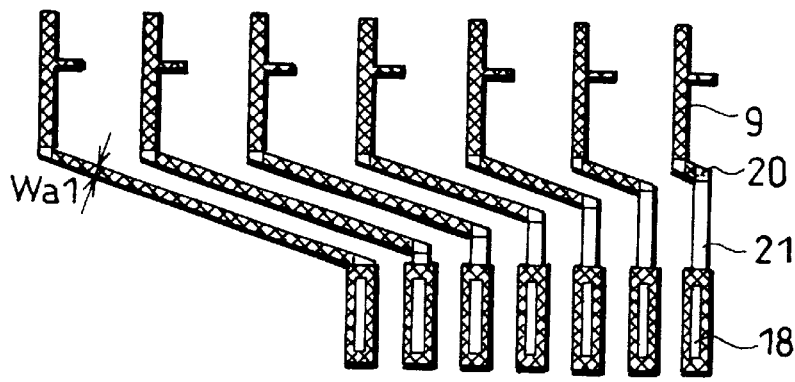

Next, a thin insulator 9 is formed over an entirety of each surface of Ta as the first conductive material. In the present embodiment, the insulators 9 are formed by anodization. After the formation of the insulators 9, through holes 18 are formed in the layer of each insulator 9 by photolithography as shown in FIG. 7(b), so that Ta as the first conductive material should be exposed there, to provide conduction of the lower electrodes 3a and the element-side terminal electrodes 10 with upper layers that are to be later provided. Simultaneously, through holes 20 are provided in a layer of each insulator 9 at least at two positions on both ends of the first part 7a so that surfaces of Ta should be exposed there. Simultaneously, a through hole 21 in a slit form is provided in each second part 7b, so that the insulator 9 should be removed from each through hole 21, and the etching is further continued so that Ta in the second part 7b should be thinned.

Figure 7C:
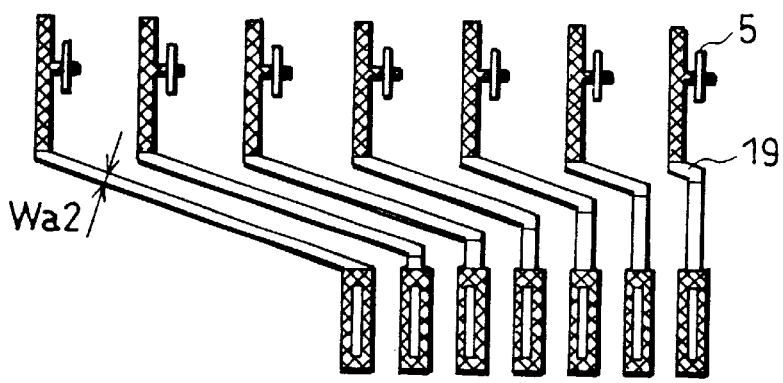

Next, as shown in FIG. 7(c), Ti as the second conductive material is laminated thereon by sputtering and thereafter patterned to predetermined shapes by photolithography, so that the upper electrodes 5 are formed. Simultaneously, the lamination wires 19 are also formed by the patterning on surfaces of the first parts 7a. As a result, Ta as the first conductive material and Ti as the second conductive material are connected via the through holes 20 in the insulators 9.

Thus, in the case where the connecting method via the through holes 20 is used, Ta as the first conductive material is protected by the insulators 9. Therefore, the following effect can be achieved: namely, a problem such that Ta in the first parts 7a is thinned upon the upper-layer-forming etching thereby having greater resistances can be prevented.

Figure 7D:
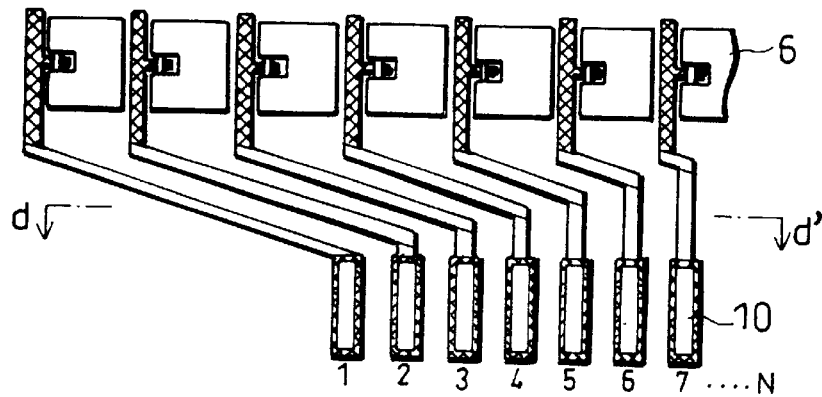
Figure 9:
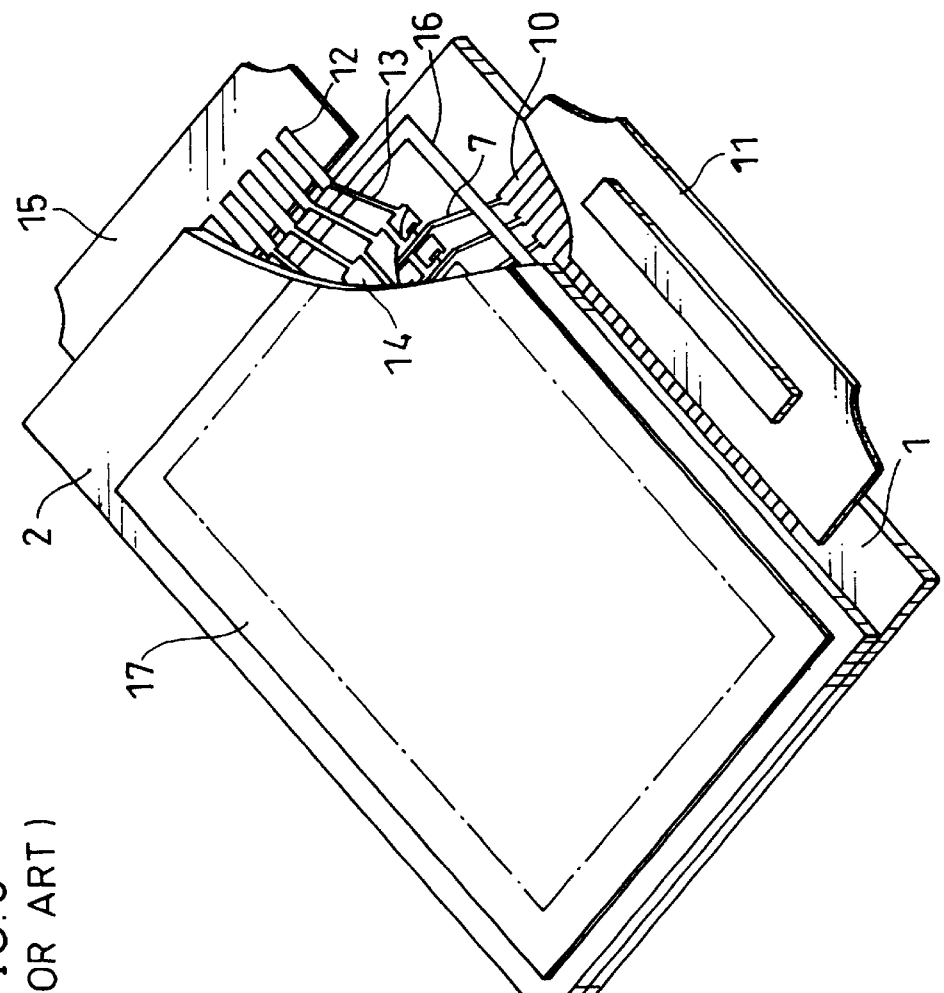
FIG. 9 is a perspective view illustrating an arrangement of a conventional liquid crystal cell.
Figure 10:
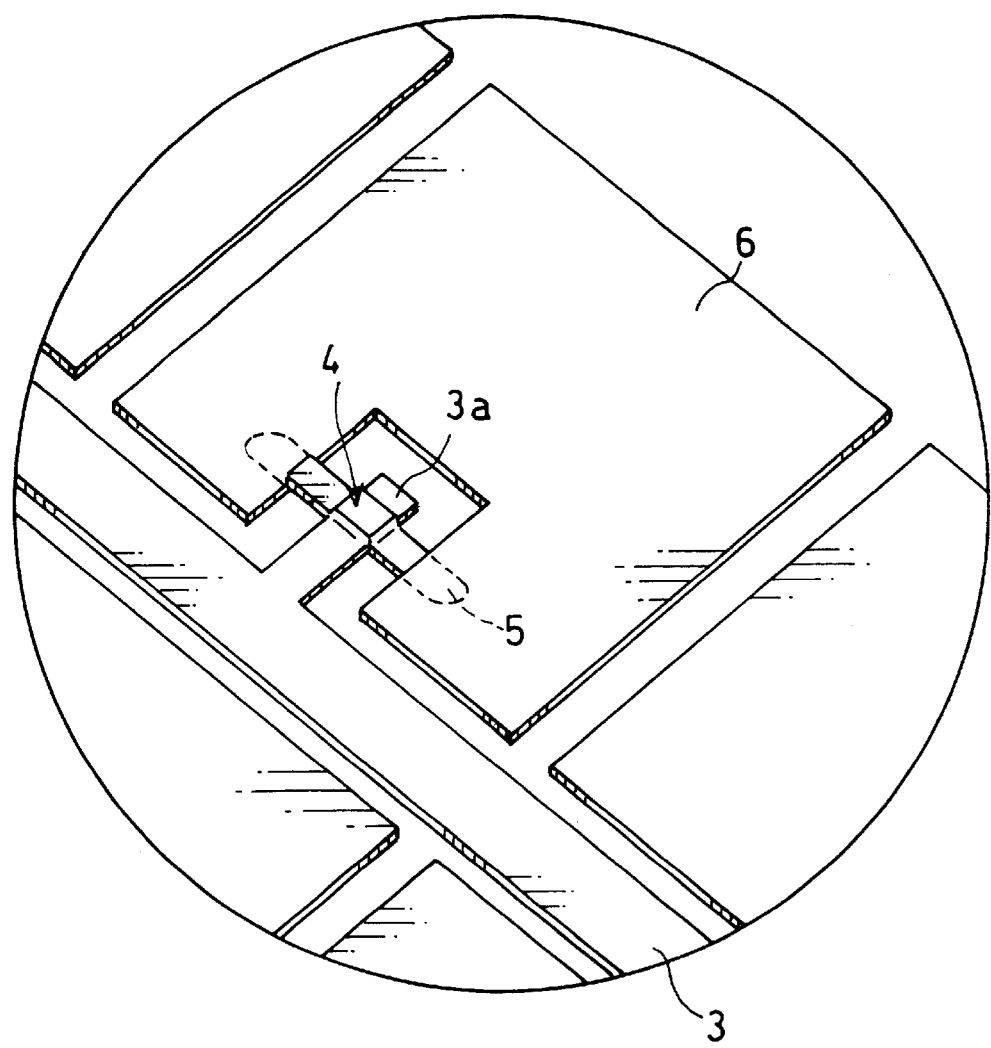
FIG. 10 is a perspective view illustrating one pixel on a conventional element substrate.
Figure 11A:
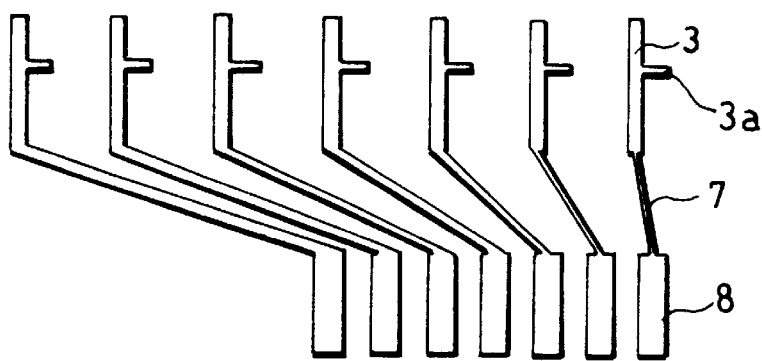
FIGS. 11(a) through 11(d) are explanatory views illustrating a process for fabricating a conventional element substrate.
Figure 11B:
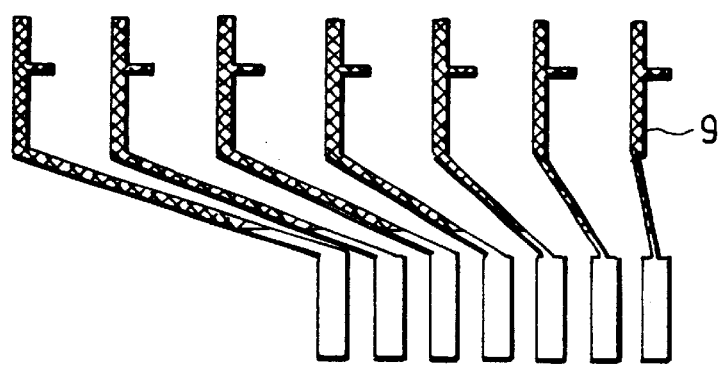
Figure 11C:
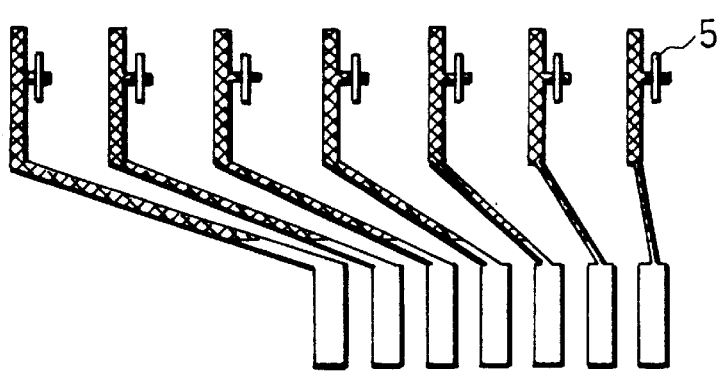
Figure 11D:
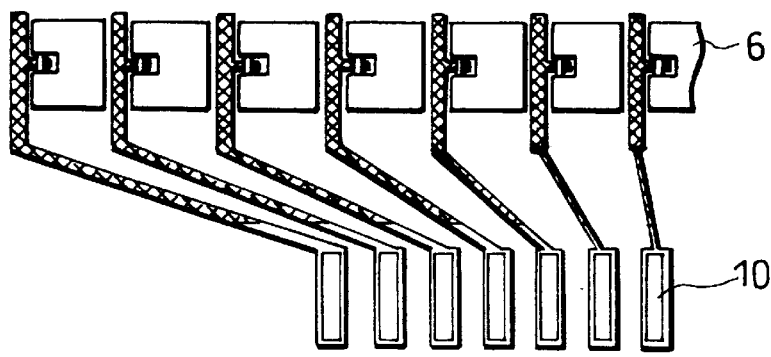
Figure 12A:
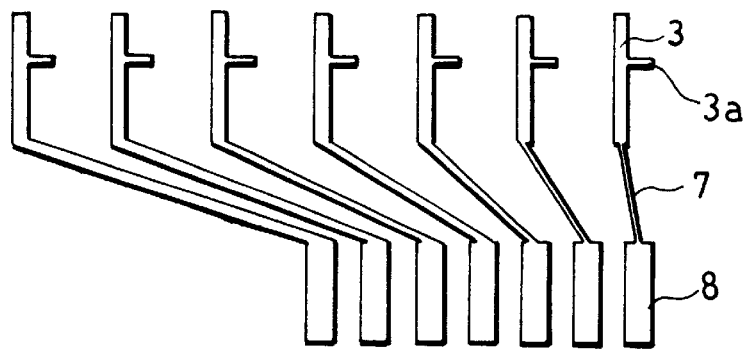
FIGS. 12(a) through 12(d) are explanatory views illustrating a process for fabricating a conventional element substrate.
Figure 12B:
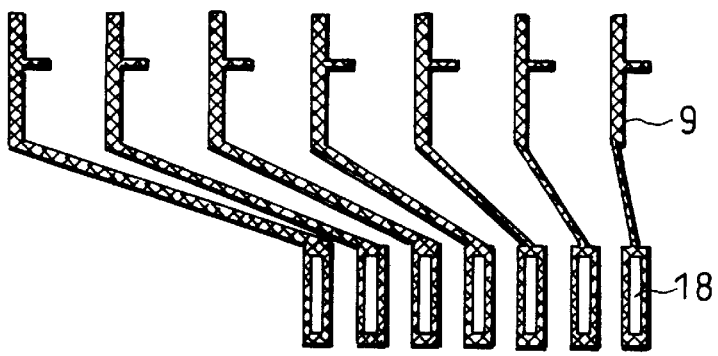
Figure 12C:
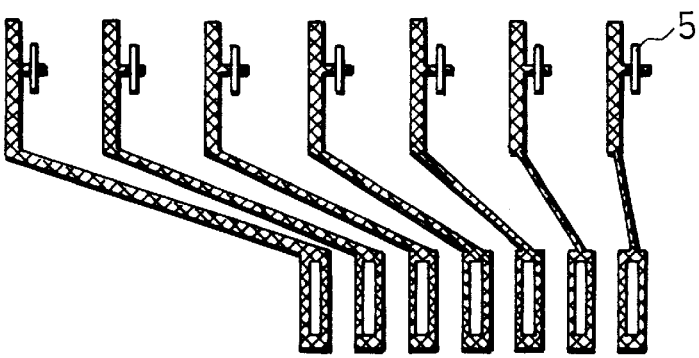
Figure 12D:
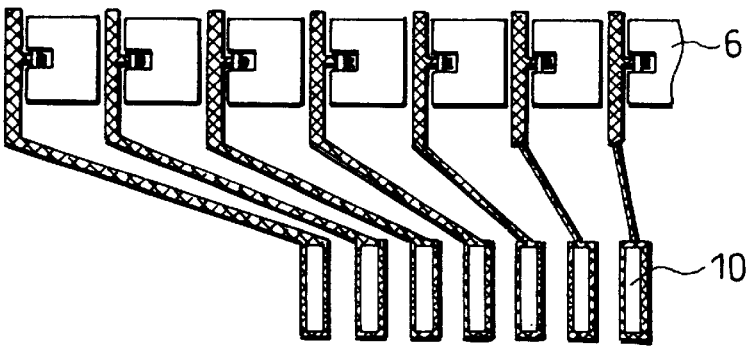

Next, as shown in FIG. 7(d), ITO as the third conductive material that is formed into the pixel electrodes 6 and the element-side terminal electrodes 10 is laminated thereon by sputtering and thereafter patterned to predetermined shapes by photolithography.

Let the connection wire 7 that is longest having a length of L be the 1st connection wire 7, while let the connection wire 7 that is shortest having a length of 1 be the N'th connection wire 7. In the foregoing process, the connection wires 7 are formed so that a length $l_a(n)$ and a length $l_b(n)$ that are lengths of the first part 7a and the second part 7b composing the n'th connection wire, respectively, should satisfy the following relationship:

$$l_a(n)=L\times(N-n)/(N-1)$$

$$l_b(n)=l\times(n-1)/(N-1)$$

In other words, the connection wire 7 is composed of the first and second parts 7a and 7b, and the connection wire 7 that is the longest (n=1) is entirely composed of the first part 7a, while the connection wire 7 that is the shortest (n=N) is entirely composed of the second part 7b.

Here, a wire resistances $R_a(n)$ of the first part 7a is expressed by the following expression:

$$R_a(n)=R_{a1}(n)\times R_{a2}(n)/(R_{a1}(n)+R_{a2}(n))$$

$$R_{a1}(n)=\rho_1\times l_a(n)/(W_{a1}\times D_1)$$

$$R_{a2}(n)=\rho_1\times l_a(n)/(W_{a2}\times D_2)$$

Further, a wire resistances $R_b(n)$ of the second part 7b is expressed by the following expression:

$$R_b(n)=R_b(n)\times R_{b1'}(n)/(R_{b1}(n)+R_{b1'}(n))$$

$$R_{b1}(n)=\rho_1\times l_b(n)/(W_{b1}\times D_1)$$

$$R_{b1'}(n)=\rho_1\times l_b(n)/(W_{b1'}\times D_{1'})$$

Therefore, the wire resistance R(n) of the n'th connection wire 7 is expressed by the following expression:

$$R(n)=R_a(n)+R_b(n)$$

Incidentally, the symbols used in the foregoing expressions represent the following:

$R_a(n)$: wire resistance of the first part 7a in the n'th wire;

$R_{a1}(n)$: wire resistance of the first conductive material of the first part 7a in the n'th wire;

$R_{a2}(n)$: wire resistance of the second conductive material of the first part 7a in the n'th wire;

$R_b(n)$: wire resistance of the second part 7b in the n'th wire;

$R_{b1}(n)$: wire resistance of the thick first conductive material in the second part 7b in the n'th wire;

$R_{b1'}(n)$: wire resistance of the thin first conductive material in the second part 7b in the n'th wire;

$\rho_1$: resistivity of the first conductive material;

$\rho_2$: resistivity of the second conductive material;

$W_{a1}$: width of the first conductive material in the first part 7a;

$W_{a2}$: width of the second conductive material in the first part 7a;

$W_{b1}$: width of the thick first conductive material in the second part 7b;

$W_{b1'}$: width of the thin first conductive material in the second part 7b;

$D_1$: thickness of the thick first conductive material;

$D_{1'}$: thickness of the thin first conductive material; and $D_2$: thickness of the second conductive material.

For instance, when L=3(mm) and l=1(mm), concrete values $\rho_1=100(\mu\Omega\cdot cm)$, $\rho_2=120(\mu\Omega\cdot cm)$, $W_{a1}=19(\mu m)$, $W_{a2}=10(\mu m)$, $W_{b1}=8(\mu m)$, $W_{b1'}=6(\mu m)$, $D_1=3000(\text{Å})$, $D_{1'}=1000(\text{Å})$, $D_2=4000(\text{Å})$ are substituted in the foregoing expressions so as to calculate $R_a(n)$ and $R_b(n)$, whereby the following are obtained:

$$R_a(n)=332\times(N-n)/(N-1) \quad (\Omega)$$

$$R_b(n)=334\times(n-1)/(N-1) \quad (\Omega)$$

Therefore, R(n) can be expressed by the following expression:

$$R(n)=332\times(N-n)/(N-1)+334\times(n-1)/(N-1) \quad (\Omega)$$

As clear from the above, as to the connection wire 7 that is longest (where n=1), the entirety thereof is composed of the first part 7a having a two-layer structure formed with the first conductive material and the second conductive material, and has a resistance of 332Ω. On the other hand, as to the connection wire 7 that is shortest (where n=N), the entirety thereof is composed of the second part 7b having a single-layer structure formed with the first conductive material, and has a resistance of 334Ω. According to the foregoing expression, R(n) is constant, not varying with the value of n. Thus, the connection wires 7 having cross-sectional structures such that resistances of the connection wires 7 are substantially equal to each other can be provided.

The conventional schemes require to make the width of the broadest connection wire 7 three times the width of the narrowest connection wire 7 since the differences in resistances of the connection wires 7 are eliminated only by adjustment of wire widths. On the contrary, in the present embodiment, the variation in the wire widths can be reduced to a range from 14 μm where narrowest to 19 μm where broadest, that is, such that the broadest portion has a width less than twice that of the narrowest portion. Therefore, all the connection wires 7 are made to have widths limited to a range such that wire-breaking and short-circuiting are suppressed, that is, a range of approximately 10 μm to 30 μm, while the resistances of the connection wires 7 are made uniform.

Furthermore, since a multiplier effect of the lamination of wires an d the th inning of wires cause a difference between the resistances of the first part 7a and the second part 7b to be more easily increased, a range of adjustment of wire resistances is increased, thereby resulting in that the degree of freedom in design, such as dimensions of the terminal sections and the liquid cell, increases.

Furthermore, in the present embodiment, the connection wires 7 are made of Ti as the second conductive material that also forms the upper electrodes 5 of the MIM elements 4. Therefore, the present invention can be realized, without adding any step to the conventional MIM element fabricating process shown in FIGS. 12(a) through 12(d), only by changing the photomask used for forming the through holes 20 and 21, and the photomask used in patterning Ti as the second conductive material. Consequently achieved is an effect that the manufacturing costs are substantially unchanged as compared with the costs in the case of the conventional MIM elements.

Incidentally, Ta as the first conductive material and Ti as the second conductive material are connected with each other through the through holes 20 provided at two positions in each insulator 9, but the through holes 20 may be provided at not less than three positions in each insulator 9, so that the effect of lowering the resistances of the connection wires 7 should not be cancelled by wire-breaking of the lamination wires 19.

Provision of a large rectangular through hole 20 over each insulator 9, however, may cause over-etching upon etching the insulator 9, thereby removing Ta as the first conductive material too deeply, and consequently, the resistance of the Ta layer may increase. Therefore, as in the present embodiment, the minimum number of the through holes 20 are preferably provided, each in the minimum size. The through holes may be provided on the surfaces of the signal wires 3 as well, and Ti as the second conductive material may be laminated thereon, so that the lowering of resistances of the signal wires 3 should be also achieved.

Incidentally, it is possible to form the lamination wires 19 with the third conductive material. Generally, however, ITO adopted so as to form the pixel electrodes 6 is relatively thinly laminated so that transmissivity of the liquid crystal cell should be ensured, thereby having a high resistance. Therefore, ITO contributes less to the lowering of resistances of the connection wires 7. Consequently, in such a case, the lamination wires 19 are preferably formed with the second conductive material as in the present embodiment.

Incidentally, Al, for instance, is adopted as the third conductive material in some cases so as to impart reflectivity to the pixel electrodes 6, so that a LCD device of not a transmission type but a reflection type should be provided. In such a case, the Al layers have an extremely small resistance, since Al has a small resistivity and since it is unnecessary to laminate Al thinly for ensuring transmissivity. Therefore, in such a case, it is effective to adopt the third conductive material so as to form the lamination wires 19.

In other words, selection of either the second conductive material or the third conductive material as a material to form the lamination wires 19 depends on contribution thereof to the lowering of resistances of the wires, and the material of the lamination wires 19 should not be particularly limited to any material.

Thereafter, application of an alignment film and a rubbing treatment are carried out to the substrate 1 as well as the counter substrate 2 that is separately fabricated, and the two substrates are combined so as to adhere to each other. Then, liquid crystal is injected to therebetween. Finally, an optical film and the circuit members 11 and 15 are attached thereto, whereby a LCD device is finished.

As described above, in the present embodiment, a wire structure of a plurality of connection wires 7 that connect signal wires 3 of a liquid crystal cell with terminals (element-side terminals 8) on an element substrate 1 on which two-terminal non-linear elements (MIM elements 4) composed of lower electrodes 3a, insulators 9, and upper electrodes 5 are formed, is arranged so that the connection wires 7 are composed of first and second connection parts (first parts 7a and second parts 7b), each of the first connection parts having a multi-layer structure made of a plurality of conductive materials in a predetermined width, each of the second connection parts having a single-layer structure made of another single conductive material in a predetermined width, a length of each first connection part increasing according to a length of the connection wire 7 that the first connection part belongs to, and (ii) the first connection part is thicker than the second connection part, and thicknesses of the first and second connection parts are set so that all the connection wires 7 should have uniform resistances. This arrangement enables to avoid short-circuiting and wire-breaking, while enables to make the resistances of the connection wires 7 uniform.

[Fifth Embodiment]

Figure 18:
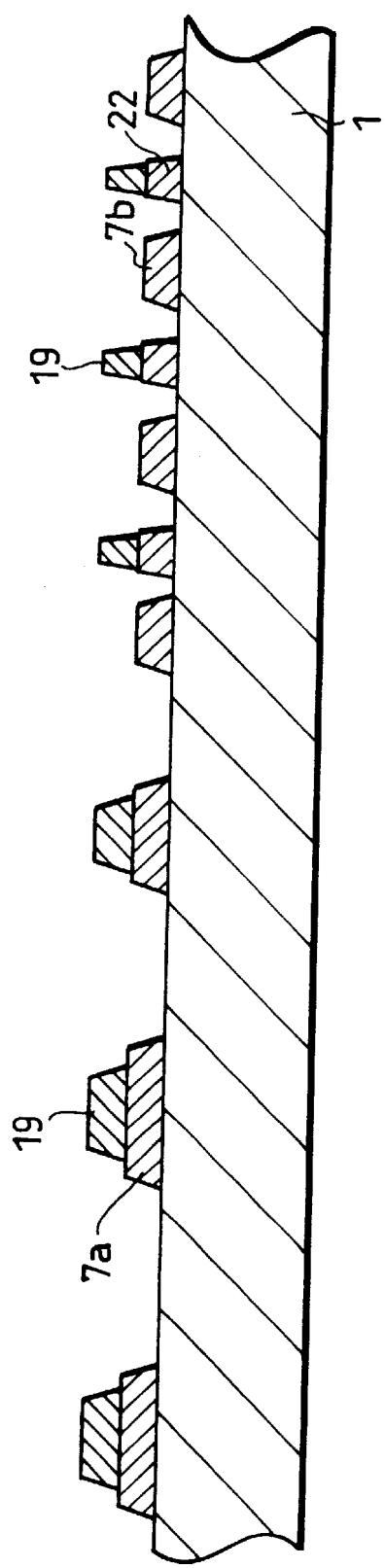
FIG. 18 is a cross-sectional view taken along a e–e' arrow line in FIG. 17(d).

The following description will explain still another embodiment of the present invention, while referring to FIGS. 17(a) through 17(d) and 18. FIGS. 17(a) through 17(d) are explanatory views illustrating steps of a process for fabricating the element substrate 1. FIG. 18 is a cross-sectional view of the substrate 1 taken along an e–e' arrow line in FIG. 17(d).

In the present fifth embodiment, the structure of the connection wire 7 in the thickness direction is varied so that the connection wires 7 should have uniform resistances, as in the first embodiment. In the LCD device in the first embodiment, however, the distance between the element substrate 1 and the counter substrate 2 when they are combined and made to adhere to each other actually becomes non-uniform due to differences in heights of structures in the first parts 7a and the second parts 7b where connected, and defects such as color irregularities occasionally occur to the regions of the first and second parts 7a and 7b and regions surrounding the same in the LCD device.

To prevent such defects, in the present fifth embodiment, dummy patterns 22 each having the same structure in the thickness direction as that of the first parts 7a are provided in spaces between the wires of the second parts 7b. This makes the height of the wire structures in the first parts 7a and that of the wire structures in the second parts 7b are substantially equal. Therefore, the gap between the element substrate 1 and the counter substrate 2 becomes uniform, and the occurrence of color irregularities due to differences in the thickness of the liquid crystal layer can be suppressed. The method of fabricating the element substrate 1 is basically identical to the method of the first embodiment, except that the dummy patterns 22 are provided. The following description will explain the method in detail.

First of all, as shown in FIG. 17(a), Ta as a first conductive material is laminated on a glass substrate by sputtering and thereafter signal wires 3 and the like are formed by patterning by photolithography. In patterning, the dummy patterns 22 are simultaneously formed in spaces between wires of the second parts 7b.

Next, as shown in FIG. 17(b), thin insulators 9 are provided by anodization. In this fifth embodiment, anodization is carried out in the state in which the entireties of not only the element-side terminals 8 but also the connection wires 7 are covered with protective resin, so that the insulators 9 should be formed exclusively inside pixel regions.

Subsequently, as shown in FIG. 17(c), Ti as the second conductive material is laminated thereon by sputtering and thereafter patterned to predetermined shapes by photolithography, so that upper electrodes 5 and lamination wires 19 are formed. Here, the second conductive material is patterned so as to be provided also on surfaces of the dummy patterns 22. By so doing, the structures of the dummy patterns 22 in the thickness direction are made identical to wire structures of the first parts 7a.

Next, as shown in FIG. 17(d), ITO as the third conductive material is laminated thereon by sputtering and thereafter patterned to predetermined shapes by photolithography so that pixel electrodes 6 and element-side terminal electrodes 10 are formed.

Thereafter, application of an alignment film and a rubbing treatment are carried out to the substrate 1 as well as the counter substrate 2 that is separately fabricated, and the two substrates are combined so as to adhere to each other. Then, liquid crystal is injected to therebetween. Finally, an optical film and circuit members 11 and 15 are attached thereto, whereby a LCD device is finished.

As described above, the dummy patterns 22 are aimed at making the gap between the element substrate 1 and the counter substrate 2 uniform, and does not contribute to adjustment of the resistances of the connection wires 7. Therefore, the dimensions and number of the dummy patterns 22 can be freely set, as long as defect patterns as causing short-circuiting between proper connection wires are not produced, and as long as the appearance of the LCD device is not spoiled. For example, the dummy patterns 22 may be reduced in number, not being provided in all the spaces between the second parts 7b. In a state of not being electrically connected with anything, however, there is possibility that defects due to discharge during the fabrication process occur. Therefore, the dummy patterns 22 are preferably connected with the proper connection wires (connection parts) such as the first parts 7a or the second parts 7b.

Furthermore, in any one of the aforementioned second, third, and fourth embodiments, needless to say, the dummy patterns 22 having identical structure to that of the first parts 7a may be provided in spaces between wires of the second parts 7b, whereby color irregularities can be suppressed. Moreover, the dummy patterns 22 may be formed in regions surrounding pixels where connection wires 7 are absent.

The dummy patterns 22 may be formed with another thin film material, but in this case steps relating to the another thin film material need be added, while adjustment of film thickness also need be carried out. Therefore, the simplest method is the method like in the present embodiment in which the dummy patterns 22 identical to the first parts 7a at least in the structure in the thickness direction are provided. This ensures the present arrangement to be realized, without adding any step to the conventional MIM element fabricating process, only by changing the photomask used for providing Ta as the first conductive material and the photomask used in patterning Ti as the second conductive material. Consequently achieved is an effect that the manufacturing costs are substantially unchanged as compared with the costs in the case of the conventional MIM elements.

So far the first through fifth embodiments of the present invention have been described by explaining the liquid crystal cells using the MIM elements 4 by way of example, but application of the present invention is not limited to these examples. For instance, the present invention can be applied to a liquid crystal cell using two-terminal non-linear elements such as TFD elements or DM elements. Furthermore, the present invention can be applied to a liquid crystal cell using bottom-gate-type TFTs, by replacing the signal wires 3 with gate electrodes, and the foregoing upper electrodes 5 with source electrodes or drain electrodes.

Furthermore, the present invention is applicable in the case where only one type of electrode material is used, like in a simple-matrix-driving-type liquid crystal cell. More specifically, steps for laminating another conductive material on the connection wires 7 and for partially thinning the connection wires 7 need be added, but it becomes possible to adjust resistances of the connection wires 7 by changing structures of the connection wires 7 in the thickness direction, in accordance with the present invention. Consequently, an effect of increasing the degree of freedom in designing the liquid crystal cell can be equally achieved.

In other words, the present invention can be applied to a flat display device using a plurality of wire materials on one substrate on which a plurality of connection wires are formed, and moreover, the present invention can be applied to a general wiring structure in which a plurality of wire materials are used on one substrate.

Furthermore, the materials and dimensions in the foregoing descriptions are mere examples, and the materials and dimensions of the present invention should not be particularly limited to the foregoing ones. For instance, in the foregoing first through fifth embodiments, the longest connection wire 7 is composed of only the first part 7a while the shortest connection wire 7 is composed of only the second part 7b, but this is an arrangement taken as an example, so that explanation can be simplified. The present invention should not be limited to this design, and every connection wire 7 may be composed the first and second parts 7a and 7b both.

Furthermore, in the foregoing first through fifth embodiments, the first part 7a and the second part 7a of the connection wire 7 have different widths, but the wire widths may be equal in the first and second parts 7a and 7b. This enables to prevent short-circuiting of wires throughout a region where the connection wires 7 are provided, irrespective of the pattern of arrangement, even in the case where the connection wires 7 are laid in a complicated arrangement.

In other words, to embody the present invention, each connection wire is divided into a plurality of connection parts, and each connection part may have a wire material and a wire structure that are appropriately selected and combined, so that a resistance of the longest connection wire and a resistance of the shortest connection wire should become substantially equal to each other.

As described above, a wire structure of the present invention is a wire structure including a plurality of connection wires that connect signal wires with terminals on a substrate, respectively, wherein each connection wire is composed of a plurality of connection parts, the connection parts having different cross-sectional structures in a thickness direction thereof thereby having different resistances, respectively, the connection parts being arranged so that the connection wires have substantially uniform resistances.

The foregoing invention ensures that signal voltages fed through terminals on a substrate are applied to desired signal wires, respectively, through connection wires.

Generally, distances from terminals on a substrate to corresponding signal wires differ from each other, thereby causing resistances of connection wires connecting the terminals with the signal wires to differ from each other. Such differences in resistances lead to irregularities in signal voltages applied to the signal wires that make the signal voltages vary from desired values, thereby causing the reliability to lower. To overcome this problem, devised is an arrangement in which widths of the connection wires are varied so as to make the resistances of the connection wires uniform. However, this leads to the following problem, when the terminal pitch decreases (spaces between terminals become narrower) as circuit integration is further promoted. Namely, it is necessary to make widths of the connection wires different so as to make all the connection wires have uniform resistances, but in the case where the connection wires are long, they are made broader in width, thereby causing short-circuiting to easily occur between adjacent ones of the same. On the other hand, in the case where the connection wires are short, they are made narrower in width, thereby causing wire-breaking to easily occur.

Conversely, according to the foregoing invention, the connection parts are made to have different cross-sectional structures in the thickness direction. In other words, it is possible to make the connection parts have different resistances per unit length in accordance with their cross-sectional structures in the thickness direction, respectively. Thus, by causing the connection parts to have different resistances, respectively, adjustment to make the resistances of the connection wires uniform is enabled. In other words, not by making the widths of the connection wires different, but by making the cross-sectional structures in the thickness direction different, the connection wires are made to have widths in an appropriate range. Consequently, the short-circuiting and wire-breaking occurring to connection wires due to non-uniform widths of the connection wires in the conventional cases can be surely prevented. The cross-sectional structures in the thickness direction can be changed by, for example, changing the thickness of the conductive material layer, or making the layer in a multi-layer structure made of not less than two different conductive materials.

Further, the foregoing plurality of connection parts are provided so that all the connection wires should have substantially uniform resistances. This ensures that resistances are substantially uniform at any terminals. Thus, since the terminals do not undergo differences in resistances, the signal voltages applied to the signal wires do not have irregularities, thereby ensuring that desired signal voltages can be applied to the terminals. Consequently, the reliability of circuit operations is enhanced.

Furthermore, when the predetermined widths of the foregoing plurality of connection parts are equal to each other, the short-circuiting between the connection wires hardly occur as compared with the conventional schemes: in the conventional schemes, the resistances are made substantially uniform between the connection wires by adjusting the wire widths of the connection wires individually; in the present invention, spaces between the connection wires are kept uniform even in the case where the connection wires are laid in a complicated arrangement.

Therefore, the resistances of the connection wires can be easily made uniform, thereby enabling to narrow spaces between the terminals. As a result, circuit members small in size and inexpensive can be used, thereby enabling to lower costs. Furthermore, a higher degree of freedom is allowed in layout of connection wires, and the number of the foregoing substrates obtained from one mother board increases. Consequently, the manufacturing costs as a whole can be surely lowered.

The foregoing wire structure is preferably arranged so that the connection wires should have widths limited in a predetermined range. In the present invention, widths of the connection wires are predetermined so that the connection wires should have uniform resistances. On the other hand required is right wiring dimensions that do not cause patterns to undergo defects such as short-circuiting between wires or wire-breaking and, in some cases, that do not cause appearance to be spoiled.

Then, by further arranging the foregoing wire structure so that the connection wires should have widths limited in a predetermined desired range, the resistances of the connection wires can be made uniform, while short-circuiting between the connection wires due to excessive broadness of the connection wires, spoiling of appearance, and wire-breaking of the connection wires due to excessive narrowness of the connection wires are prevented.

A liquid crystal display device of the present invention is an LCD device having a wire structure including a plurality of connection wires that connect signal wires with terminals on a substrate, respectively, wherein each connection wire is composed of a plurality of connection parts, the connection parts having different cross-sectional structures in a thickness direction thereof thereby having different resistances, respectively, the connection parts being arranged so that the connection wires have substantially uniform resistances.

In the foregoing present invention, signal voltages fed through terminals on a substrate are applied to liquid crystal cells in the LCD device through desired signal wires and connection wires, whereby the desired liquid crystal cells are actuated.

Generally, distances from terminals to signal wires differ from each other, and hence, resistances of the connection wires also differ from each other. Such differences in resistances lead to irregularities in signal voltages applied to the signal wires, thereby causing shades of display at the pixels to deviate from appropriate ones. Consequently, desired display cannot be obtained. To overcome this, an arrangement in which widths of the connection wires are varied so that the connection wires should have uniform resistances is devised.

Making the liquid crystal cell smaller in size causes spaces between terminals on the substrate narrower, that is, causes a so-called terminal pitch to decrease, thereby causing a problem as follows. Namely, it is required to make widths of the connection wires different so as to make the resistances of all the connection wires substantially uniform, but in the case where the connection wires are long, they are made broader in width, thereby causing short-circuiting to easily occur between adjacent ones of the same. On the other hand, in the case where the connection wires are short, they are made narrower in width, thereby causing wire-breaking to easily occur.

Conversely, according to the above-described present invention, the connection parts are made to have different cross-sectional structures in the thickness direction, respectively. In other words, it is possible to make the connection parts have different resistances per unit length in accordance with their cross-sectional structures in the thickness direction, respectively. Thus, by causing the connection parts to have different resistances, respectively, adjustment to make the resistances of the connection wires uniform is enabled. In other words, not by making the widths of the connection wires different, but by making the cross-sectional structures in the thickness direction different, the connection wires are made to have widths in an appropriate range. Consequently, the short-circuiting and wire-breaking occurring to connection wires due to non-uniform widths of the connection wires in the conventional cases can be surely prevented. The cross-sectional structures in the thickness direction can be changed by, for example, changing the thickness of the conductive material layer, or making the layer in a multi-layer structure made of not less than two different conductive materials.

The connection parts have widths limited to a predetermined range so that production of defect patterns should be suppressed. Therefore, the foregoing short-circuiting and wire-breaking due to excessively broad or narrow wire widths do not occur. Since the connection wires have right widths, even a liquid crystal cell in which connection wires are directly viewed, such as monochrome-display-type liquid crystal cell, do not undergo connection wire pattern irregularities such as excessively broad wires or changes in width. Therefore, appearance thereof is not spoiled.

Furthermore, the foregoing plurality of connection parts are arranged so that the connection wires should have substantially uniform resistances. As a result, the resistances of the connection wires are. made substantially uniform. Since differences in the resistances at the terminals are thus eliminated, signal voltages applied to the signal wires do not have irregularities, thereby allowing shades of display at the pixels to be properly regulated. Consequently, desired display can be obtained. Thus, the reliability of pixel display is remarkably enhanced.

Therefore, since the resistances of the connection wires are easily made uniform, this provides decrease in the terminal pitch. This enables to use circuit members small in size and inexpensive, thereby lowering costs as a whole. Furthermore, a higher degree of freedom is allowed in layout of connection wires, and the number of the foregoing substrates obtained from one mother board increases. Consequently, the manufacturing costs as a whole can be surely lowered.

The foregoing LCD device is preferably arranged so that the connection wires should have widths limited in a predetermined range. In the present invention, widths of the connection wires are predetermined so that the connection wires should have uniform resistances. On the other hand required is right wiring dimensions that do not cause patterns to undergo defects such as short-circuiting between wires or wire-breaking and, in some cases, that do not cause appearance to be spoiled.

Then, by further arranging the foregoing LCD device so that the connection wires should have widths limited in a predetermined desired range, the resistances of the connection wires can be made uniform, while short-circuiting between the connection wires due to excessive broadness of the connection wires, spoiling of appearance, and wire-breaking of the connection wires due to excessive narrowness of the connection wires are prevented.

This enables to decrease the terminal pitch of the signal input terminals for feeding signal voltages to desired liquid crystal cells. This enables to use circuit members small in size and inexpensive, thereby lowering costs as a whole. Furthermore, a higher degree of freedom is allowed in layout of connection wires, and the number of the foregoing substrates obtained from one mother board increases. Consequently, the manufacturing costs as a whole can be surely lowered.

Furthermore, the foregoing LCD device is preferably further arranged so that the connection parts have widths such that occurrence of defect patterns can be suppressed. In the present invention, widths of the connection wires are predetermined so that the connection wires should have uniform resistances. On the other hand required is right wiring dimensions that do not cause patterns to undergo defects such as short-circuiting between wires or wire-breaking.

In order not to cause wire-breaking of the connection wires, approximately 10 μm as a wire width of the connection wires is required though it depends on performances of manufacturing lines of the liquid crystal cells. On the other hand, the wires with a wire width exceeding 30 μm, for example, may cause the degree of freedom in pattern designing of the connection wires to drastically decrease, though it depends on layout of connection wires and cross-sectional structures of the connection wires. Consequently, it becomes difficult to provide sufficient spaces between the connection wires, thereby making higher the possibility of causing short-circuiting between the connection wires.

Therefore, in the foregoing LCD device, by making the connection parts have widths such that occurrence of defect patterns can be suppressed, the resistances of the connection wires can be made uniform, while the occurrence of defect patterns in the connection wires can be suppressed.

In the foregoing LCD device, a length of each connection part is preferably set according to a length of the connection wire that the connection part belongs to. As the number of the connection parts increases, the setting of respective lengths of the plurality of connection parts in each connection wire becomes more complicated, thereby takes a longer time. However, in the foregoing case, the connection parts have the predetermined widths, and therefore, the resistances thereof vary in accordance with the lengths thereof in the case where the materials are the same. Since the lengths of the connection parts of each connection wire are set in accordance with the length of each connection wire, the setting of resistances of the plurality of connection parts of each connection wire can be carried out within a short time.

The foregoing LCD device is preferably further arranged so that the plurality of connection parts are first and second connection parts, and that each of the first and second connection parts has a multi-layer structure made of a plurality of conductive materials.

In this case, since the first and second connection parts have multi-layer structures made of a plurality of conductive materials, the plurality of conductive materials formed in the multi-layer structure are connected electrically in parallel. Therefore, even if one of the wires of the plurality of conductive materials is electrically broken, the conductive material undergoing brokage, unless exfoliating, contributes to the lowering of resistances of the multi-layer structure, while electrical connection of the first connection part with the second connection part, or of the second connection part with the first connection part, remains maintained unless the wire of the other conductive material is not electrically broken. Consequently, the reliability of the wire structure is remarkably enhanced.

Furthermore, the foregoing LCD device is preferably further arranged so that the first connection part is thicker than the second connection part, and thicknesses of the first and second connection parts are set so that all the connection wires should have uniform resistances.

Since the first connection part is formed thicker than the second connection part, generally it is easy to make the resistance of the first connection part smaller than the resistance of the second connection part. Therefore, by appropriately adjusting not only the layer structures of the first and second connection parts but also the thicknesses of the first and second connection parts, the resistances of the first and second connection parts can be adjusted. Consequently, the degree of freedom in wire layout can be increased, while the resistance of the connection wires can be made uniform.

Still another LCD device in accordance with the present invention has a wire structure of connection wires that connect signal wires with terminals on a substrate, respectively, and is characterized in that (i) the connection wires are composed of first and second connection parts, each of the first connection parts having a single-layer structure made of a single conductive material in a predetermined width, each of the second connection parts having a single-layer structure made of another single conductive material in a predetermined width, a length of each first connection part increasing according to a length of the connection wire that the first connection part belongs to, and (ii) the first connection part is thicker than the second connection part, and thicknesses of the first and second connection parts are set so that all the connection wires should have uniform resistances.

In the foregoing arrangement, since the first connection part having a predetermined width is thicker than the second connection part having a predetermined width, it is easy to arrange so that the first connection part has a resistance per unit length smaller than that of the second connection part.

Generally, each connection wire has a resistance proportional to its entire length, and according to the foregoing arrangement, the first connection part having a smaller resistance per unit length than that of the second connection part is formed longer so that a proportion of the first connection part in the entirety of the connection wire increases. Consequently, it becomes easier to make uniform the resistances of the connection wires that differ in length. Furthermore, since the first and second connection parts both are in a single-layer structure made of a single conductive material, designing and production are both easier as compared with the case of the multi-layer structure. Thus, with the simpler arrangement, the resistances of the connection wires can be made uniform.

Therefore, differences in the resistances at the terminals are thus eliminated, and signal voltages applied to the signal wires do not have irregularities. This allows shades of display at the pixels to be properly regulated, and desired display can be obtained. Thus, the reliability of pixel display is remarkably enhanced.

Therefore, since the resistances of the connection wires are easily made uniform, this provides decrease in the terminal pitch. This enables to use circuit members small in size and inexpensive, thereby lowering costs as a whole. Furthermore, a higher degree of freedom is allowed in layout of connection wires, and the number of the foregoing substrates obtained from one mother board increases. Consequently, the manufacturing costs as a whole can be surely lowered.

The connection parts have widths limited to a predetermined range so that production of defect patterns should be suppressed. Therefore, the foregoing short-circuiting and wire-breaking due to excessively broad or narrow wire widths do not occur. Since the connection wires have right widths, even a liquid crystal cell in which connection wires are directly viewed, such as monochrome-display-type liquid crystal cell, do not undergo connection wire pattern irregularities such as excessively broad wires or changes in width. Therefore, appearance thereof is not spoiled.

A substrate fabricating method in accordance with the present invention is a method for fabricating a substrate having wire structure, and is characterized by including the steps of (i) patterning a first conductive material that will be formed into connection wires, each connection wire having a plurality of connection parts having predetermined widths, and (ii) either processing the first conductive material or patterning another conductive material, so that all the connection wires should have substantially uniform resistances.

Generally, in the case where a plurality of connection wires for connecting signal wires with terminals for feeding signals to the substrate are present, the connection wires are in many cases necessarily arranged so as to have different lengths under restrictions in view of design. In such a case, signal voltages applied to the signal wires tend to have irregularities due to differences in the resistances of the connection wires, thereby deviating from desired levels. Consequently, the reliability lowers. To overcome this drawback, devised is an arrangement in which the widths are varied from one connection wire to another so that the resistances of the connection wires should be made uniform.

However, this leads to the following problem, when the terminal pitch (spaces between terminals) decreases as circuit integration is further promoted. Namely, it is necessary to make widths of the connection wires different so as to make all the connection wires have uniform resistances, but in the case where the connection wires are long, they are made broader in width, thereby causing short-circuiting to easily occur between adjacent ones of the same. On the other hand, in the case where the connection wires are short, they are made narrower in width, thereby causing wire-breaking to easily occur.

Conversely, according to the above-described present invention, the connection wires formed by patterning the first conductive material have widths limited to a predetermined range so that production of defect patterns should be suppressed. Therefore, the foregoing short-circuiting and wire-breaking due to excessively broad or narrow wire widths do not occur.

Furthermore, the foregoing plurality of connection parts enable to conduct the processing of the first conductive material or the patterning of another conductive material so that the connection wires have substantially uniform resistances. Here, the processing of the first conductive material may be carried out by any desired method, such as etching or heat treatment by laser. The processing of the first conductive material or the patterning of another conductive material may be carried out with respect to a part of the plurality of connection parts, or the connection parts may be respectively subjected to different treatments. By so doing the resistances of the connection wires are made substantially uniform. Consequently, signal voltages applied to the signal wires do not have irregularities, and this allows desired signal voltages to be applied to the terminals, respectively. As a result, the reliability of the circuit operations is enhanced.

Therefore, since the resistances of the connection wires are easily made uniform, this provides decrease in the terminal pitch. This enables to use circuit members small in size and inexpensive, thereby lowering costs as a whole. Furthermore, a higher degree of freedom is allowed in layout of connection wires, and the number of the foregoing substrates obtained from one mother board increases. Consequently, the manufacturing costs as a whole can be surely lowered.

A method for fabricating a liquid crystal display device in accordance with the present invention is a method for fabricating a liquid crystal display device having a wire structure of connection wires that connect signal wires with terminals on a substrate, and is characterized by including the steps of (i) patterning a first conductive material that will be formed into connection wires, each connection wire having a plurality of connection parts having predetermined widths, and (ii) either processing the first conductive material or patterning another different conductive material, so that all the connection wires should have substantially uniform resistances.

In the liquid crystal cell, signal voltages supplied through the terminals on the element substrate are applied to pixel electrodes via desired connection wires and signal wires, thereby actuating desired pixels.

Generally, distances from terminals to signal wires differ from each other, and hence, resistances of the connection wires also differ from each other. Such differences in resistances lead to irregularities in signal voltages applied to the signal wires, thereby causing shades of display at the pixels to deviate from appropriate ones. Consequently, desired display cannot be obtained. To overcome this, an arrangement in which widths of the connection wires are varied so that the connection wires should have uniform resistances is devised.

Making the liquid crystal cell smaller in size causes spaces between terminals on the substrate narrower, that is, causes a so-called terminal pitch to decrease, thereby causing a problem as follows. Namely, it is required to make widths of the connection wires different so as to make the resistances of all the connection wires substantially uniform, but in the case where the connection wires are long, they are made broader in width, thereby causing short-circuiting to easily occur between adjacent ones of the same. On the other hand, in the case where the connection wires are short, they are made narrower in width, thereby causing wire-breaking to easily occur.

According to the present invention, the connection parts have widths limited to a predetermined range so that production of defect patterns should be suppressed. Therefore, the foregoing short-circuiting and wire-breaking due to excessively broad or narrow wire widths do not occur. Since the connection wires have right widths, even a liquid crystal cell in which connection wires are directly viewed, such as monochrome-display-type liquid crystal cell, do not undergo connection wire pattern irregularities such as excessively broad wires or changes in width. Therefore, appearance thereof is not spoiled.

Furthermore, the foregoing plurality of connection parts are arranged so that the connection wires should have substantially uniform resistances. As a result, the resistances of the connection wires are made substantially uniform. Since differences in the resistances at the terminals are thus eliminated, signal voltages applied to the signal wires do not have irregularities, thereby allowing shades of display at the pixels to be properly regulated. Consequently, desired display can be obtained. Thus, the reliability of pixel display is remarkably enhanced.

Therefore, since the resistances of the connection wires are easily made uniform, this provides decrease in the terminal pitch. This enables to use circuit members small in size and inexpensive, thereby lowering costs as a whole. Furthermore, a higher degree of freedom is allowed in layout of connection wires, and the number of the foregoing substrates obtained from one mother board increases. Consequently, the manufacturing costs as a whole can be surely lowered.

Furthermore, in the foregoing LCD device fabricating method, a length of each connection part is preferably set according to a length of the connection wire that the connection part belongs to.

As the number of the connection parts increases, the setting of respective lengths of the plurality of connection parts in each connection wire becomes more complicated, thereby takes a longer time. However, in the foregoing case, the connection parts have the predetermined widths, and therefore, the resistances thereof vary in accordance with the lengths thereof in the case where the materials are the same.

Thus, since the lengths of the connection parts of each connection wire are set in accordance with the length of each connection wire, the setting of resistances of the plurality of connection parts of each connection wire can be carried out within a short time.

In the foregoing LCD fabricating method, the another conductive material is preferably a conductive material used in the element substrate.

The foregoing another conductive material serves to appropriately adjust resistances of the plurality of connection parts of the connection wires so that the connection wires should have uniform resistances. Here, the same conductive material as that used for forming elements included in the element substrate is used as the another conductive material, the patterning of the another conductive material can be realized merely by changing the photomask used for patterning the second conductive material.

By so doing, the resistances of the plurality of connection parts of the connection wires can be adjusted only by patterning the second conductive material, without adding any new step to the conventional element substrate fabricating process. Therefore, an LCD device can be produced at costs substantially equal to the costs in the case where a conventional LCD device is produced.

Furthermore, in the foregoing LCD device fabricating method, the first conductive material and the another conductive material are preferably connected with each other through holes in a protective film layer provided on the first conductive material at at least two positions regarding each piece of the first conductive material.

According to the foregoing arrangement, a protective film is provided on the first conductive material. Therefore the following problem can be prevented: the first conductive material tends to become thinner due to erosion upon the patterning of the another conductive material or the other occasions, thereby resulting in that the resistance of the first conductive material increases.

On the other hand, since conduction of the another conductive material with the first conductive material is provided at at least two positions on each piece of the first conductive material, electric connection between the first conductive material and the another conductive material in parallel is secured.

This enables to protect the structure of the first conductive material from changes by means of the protective film layer while to lower the wire resistances. Therefore an LCD device can be produced in which the first conductive material has stable resistances while a higher degree of freedom is allowed in designing, and further, variations of the wire resistances in production can be suppressed.

In the LCD device, the method for fabricating a substrate, and the method for fabricating an LCD device in accordance with the present invention, each of the 1plurality of connection wires is composed of a first connection part and a second connection part, a wire structure of the first connection part having a greater thickness than that of the second connection part, wherein dummy patterns each having the same cross-sectional structure in the thickness direction as that of the first connection part are provided in spaces between wires of the second connection parts.

Generally, in an LCD device, it is important to make uniform the thickness of a liquid crystal layer provided between an element substrate and a counter substrate, and non-uniformity in thickness causes color irregularity in vision, thereby deteriorating the quality of the LCD device.

In the foregoing invention, since pattern surfaces of the first connection parts are higher than the surface of the element substrate, the liquid crystal layer is thinner at the positions corresponding to the first connection parts. On the other hand, since pattern surfaces of the second connection parts are lower than the surface of the element substrate, the liquid crystal layer is thicker at the positions corresponding to the second connection parts. Therefore, in this state, the vicinity of the first connection part and the vicinity of the second connection part in the LCD device have different background colors, respectively, thereby spoiling the appearance of the LCD device.

According to the foregoing invention, dummy patterns that are identical to the first connection parts at least in the cross-sectional structure in the thickness direction are further provided in spaces between wires of the second parts. This causes the height of the pattern surfaces of the first connection parts to become substantially equal to the height of the pattern surface of the second connection parts including the dummy patterns, thereby causing no color irregularities. Consequently, the appearance of the LCD device can be maintained.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A wire structure comprising a plurality of connection wires of different lengths that connect a plurality of signal wires with a plurality of terminals on a substrate, respectively, wherein:

each of said connection wires connects one of the plurality of signal wires with one of the plurality of terminals is made up of a plurality of connection parts, connected in series, having different cross-sectional structures, respectively, so that the connection parts should have different resistances; and said plurality of connection parts are arranged so that all said connection wires should have substantially uniform resistances from the plurality of signal wires to the plurality of terminals.

2. The wire structure as set forth in claim 1, wherein said connection wires have widths limited in a predetermined range.

3. The liquid crystal display device as set forth in claim 2, wherein said connection wires have widths not more that about 30 $\mu$m.

4. The liquid crystal display device as set forth in claim 1, wherein the cross-sectional structures differ where each of the connection parts includes a conductive material layer of a different thickness.

5. The liquid crystal display device as set forth in claim 1, wherein the cross-sectional structures differ where each of the connection parts include a different multi-layer structure made of a plurality of conductive materials.

6. A liquid crystal display device, comprising:

a substrate; and a wire structure of a plurality of connection wires of different lengths that connect a plurality of signal wires with a plurality of terminals on said substrate, respectively, wherein each of said connection wires connects one of the plurality of signal wires with one of the plurality of terminals is made up of a plurality of connection parts, connected in series, having different cross-sectional structures, respectively, so that the connection parts should have different resistances, and said plurality of connection parts are arranged so that all said connection wires should have substantially uniform resistances from the plurality of signal wires to the plurality of terminals.

7. The liquid crystal display device as set forth in claim 6, wherein a length of each of said connection parts is set according to a length of said connection wire that said connection part belongs to.

8. The liquid crystal display device as set forth in claim 7, wherein said connection parts are first and second connection parts connected in series, and each of said first and second connection parts has a multi-layer structure made of a plurality of conductive materials.

9. The liquid crystal display device as set forth in claim 8, wherein said first connection part is thicker than said second connection part, and thicknesses of said first and second connection parts are set so that all said connection wires should have uniform resistances.

10. The liquid crystal display device as set forth in claim 9, wherein dummy patterns each being identical to said first connection part at least in the cross-sectional structure are provided in spaces between wires of said second connection parts.

11. The liquid crystal display device as set forth in claim 6, wherein said connection wires have widths limited in a predetermined range.

12. The liquid crystal display device as set forth in claim 11, wherein a length of each of said connection parts is set according to a length of said connection wire that said connection part belongs to.

13. The liquid crystal display device as set forth in claim 12, wherein said connection parts are first and second connection parts connected in series, and each of said first and second connection parts has a multi-layer structure made of a plurality of conductive materials.

14. The liquid crystal display device as set forth in claim 13, wherein said first connection part is thicker than said second connection part, and thicknesses of said first and second connection parts are set so that all said connection wires should have uniform resistances.

15. The liquid crystal display device as set forth in claim 11, wherein dummy patterns each being identical to said first connection part at least in the cross-sectional structure are provided in spaces between wires of said second connection parts.

16. The liquid crystal display device as set forth in claim 11, wherein said connection wires have widths such that occurrence of defect patterns can be suppressed.

17. The liquid crystal display device as set forth in claim 16, wherein a length of each of said connection parts is set according to a length of said connection wire that said connection part belongs to.

18. The liquid crystal display device as set forth in claim 16, wherein said connection wires have widths not less than about 10 $\mu$m.

19. The liquid crystal display device as set forth in claim 17, wherein said connection parts are first and second connection parts connected in series, and each of said first and second connection parts has a multi-layer structure made of a plurality of conductive materials.

20. The liquid crystal display device as set forth in claim 19, wherein said first connection part is thicker than said second connection part, and thicknesses of said first and second connection parts are set so that all said connection wires should have uniform resistances.

21. The liquid crystal display device as set forth in claim 20, wherein dummy patterns each being identical to said first connection part at least in the cross-sectional structure are provided in spaces between wires of said second connection parts.

22. The liquid crystal display device as set forth in claim 6, wherein:

said connection parts are composed of first and second connection parts, each of said first connection parts having a single-layer structure made of a single conductive material in a predetermined width, each of said second connection parts having a single-layer structure made of another single conductive material in a predetermined width, a length of each first connection part increasing according to a length of said connection wire that said first connection part belongs to; and said first connection part is thicker than said second connection part, and thickness of said first and second connection parts are set so that all said connection wires should have uniform resistances.

23. The liquid crystal display device as set forth in claim 22, wherein dummy patterns each being identical to said first connection part at least in the cross-sectional structure are provided in spaces between wires of said second connection parts.

* * * * *